United States Patent
Desclos et al.

(10) Patent No.: US 10,355,722 B2
(45) Date of Patent: Jul. 16, 2019

(54) MULTI-MODE MULTI-BAND SELF-REALIGNING POWER AMPLIFIER

(71) Applicant: Ethertronics, Inc., San Diego, CA (US)

(72) Inventors: Laurent Desclos, San Diego, CA (US); Alexandre Dupuy, San Diego, CA (US)

(73) Assignee: Ethertronics, Inc., San Diego, CA (US)

( * ) Notice: Subject to any disclaimer, the term of this patent is extended or adjusted under 35 U.S.C. 154(b) by 0 days.

(21) Appl. No.: 14/953,175

(22) Filed: Nov. 27, 2015

(65) Prior Publication Data

US 2016/0080005 A1 Mar. 17, 2016

Related U.S. Application Data

(62) Division of application No. 13/557,173, filed on Jul. 24, 2012, now Pat. No. 9,231,536.

(60) Provisional application No. 61/511,114, filed on Jul. 24, 2011.

(51) Int. Cl.

| | |
|---|---|
| *H01Q 11/12* | (2006.01) |
| *H04B 1/04* | (2006.01) |
| *H04B 1/00* | (2006.01) |
| *H03F 3/24* | (2006.01) |
| *H04W 88/06* | (2009.01) |
| *H03F 1/02* | (2006.01) |
| *H03F 1/56* | (2006.01) |
| *H03F 3/21* | (2006.01) |
| *H03F 3/60* | (2006.01) |
| *H03F 3/68* | (2006.01) |

(52) U.S. Cl.
CPC ............ *H04B 1/006* (2013.01); *H03F 1/0277* (2013.01); *H03F 1/565* (2013.01); *H03F 3/211* (2013.01); *H03F 3/245* (2013.01); *H03F 3/602* (2013.01); *H03F 3/68* (2013.01); *H04W 88/06* (2013.01); *H03F 2200/111* (2013.01); *H03F 2200/318* (2013.01); *H03F 2200/378* (2013.01); *H03F 2200/408* (2013.01); *H03F 2200/423* (2013.01); *H03F 2200/543* (2013.01)

(58) Field of Classification Search
USPC ............ 455/127.1–127.5, 552.1, 553.1, 125
See application file for complete search history.

(56) References Cited

U.S. PATENT DOCUMENTS

| | | |
|---|---|---|
| 5,367,310 A | 11/1994 | Warnagiris |
| 5,796,772 A * | 8/1998 | Smith .................. G10L 19/012 375/130 |
| 6,332,071 B1 | 12/2001 | Brandt |

(Continued)

*Primary Examiner* — Edward F Urban
*Assistant Examiner* — Rui M Hu
(74) *Attorney, Agent, or Firm* — Dority & Manning, P.A.

(57) ABSTRACT

A power amplifier (PA) system is provided for multi-mode multi-band operations. The PA system includes one or more amplifying modules, each amplifying module including one or more banks, each bank comprising one or more transistors; and a plurality of matching modules, each matching module being configured to be adjusted to provide impedances corresponding to frequency bands and conditions. A controller dynamically controls an input terminal of each bank and adjusts the matching modules to provide a signal path to meet specifications on properties associated with signals during each time interval.

12 Claims, 18 Drawing Sheets

(56) References Cited

U.S. PATENT DOCUMENTS

| | | | |
|---|---|---|---|
| 6,337,664 B1 | 1/2002 | Mayes et al. | |
| 6,356,536 B1 | 3/2002 | Repke | |
| 6,501,331 B2 * | 12/2002 | Adar | H03F 1/0261 330/126 |
| 6,765,536 B2 | 7/2004 | Phillips et al. | |
| 6,876,337 B2 | 4/2005 | Larry | |
| 6,970,040 B1 * | 11/2005 | Dening | H03F 1/0277 330/124 R |
| 7,053,845 B1 | 5/2006 | Holloway et al. | |
| 7,092,676 B2 * | 8/2006 | Abdelgany | H04B 1/005 455/76 |
| 7,132,989 B1 | 11/2006 | Poilasne | |
| 7,146,139 B2 * | 12/2006 | Nevermann | H04B 1/3838 455/115.1 |
| 7,157,966 B2 * | 1/2007 | Baree | H03F 1/0261 330/133 |
| 7,345,534 B2 * | 3/2008 | Grebennikov | H03F 1/0277 330/124 R |
| 7,505,743 B2 * | 3/2009 | Kim | H04B 1/006 455/115.3 |
| 7,554,392 B2 * | 6/2009 | Hwa | H03F 1/0261 330/302 |
| 7,715,812 B2 * | 5/2010 | Tsutsui | H03F 1/0205 455/127.4 |
| 7,729,724 B2 * | 6/2010 | Rofougaran | H04B 1/48 455/102 |
| 7,834,813 B2 | 11/2010 | Caimi et al. | |
| 7,876,159 B2 * | 1/2011 | Wang | H03F 1/0288 330/124 R |
| 8,041,386 B2 * | 10/2011 | Rofougaran | H04B 1/08 455/102 |
| 8,090,328 B2 * | 1/2012 | Rofougaran | H04B 1/04 455/127.1 |
| 8,154,340 B2 * | 4/2012 | Dupuy | H01P 1/2039 330/126 |
| 8,280,325 B2 * | 10/2012 | Zolfaghari | H04B 1/0483 330/171 |
| 8,330,551 B2 * | 12/2012 | Lim | H03F 1/565 330/302 |
| 8,466,745 B2 * | 6/2013 | Guo | H03F 1/0261 330/285 |
| 8,502,599 B2 * | 8/2013 | Conradi | H03F 1/0288 330/126 |
| 8,571,498 B2 * | 10/2013 | Khlat | H03F 1/0244 455/127.1 |
| 8,666,338 B2 * | 3/2014 | Zhao | H03F 1/0277 330/124 R |
| 8,750,810 B2 * | 6/2014 | Pletcher | H03F 1/56 330/144 |
| 8,884,692 B2 * | 11/2014 | Lee | H03F 3/72 330/124 R |
| 8,947,165 B2 * | 2/2015 | Cho | H03F 3/211 330/124 R |
| 8,971,830 B2 * | 3/2015 | Hadjichristos | H03F 1/0277 455/127.4 |
| 2003/0076174 A1 * | 4/2003 | Tanoue | H01L 24/05 330/302 |
| 2005/0197078 A1 * | 9/2005 | Yoshimoto | H04B 1/406 455/127.4 |
| 2006/0135083 A1 * | 6/2006 | Leinonen | H04B 1/0057 455/78 |
| 2006/0194551 A1 * | 8/2006 | Sato | H03F 1/0205 455/127.1 |
| 2006/0290431 A1 * | 12/2006 | Shimizu | H01L 23/66 330/307 |
| 2007/0222697 A1 * | 9/2007 | Caimi | H01Q 1/243 343/861 |
| 2007/0252651 A1 * | 11/2007 | Gao | H03F 1/56 330/302 |
| 2008/0242346 A1 * | 10/2008 | Rofougaran | H04B 1/0067 455/552.1 |
| 2009/0002077 A1 * | 1/2009 | Rohani | H03F 1/565 330/305 |
| 2009/0174475 A1 * | 7/2009 | Yuen | H03F 1/0216 330/133 |
| 2009/0289861 A1 | 11/2009 | Tang et al. | |
| 2010/0207703 A1 * | 8/2010 | Dupuy | H01P 1/2039 333/132 |
| 2010/0215121 A1 | 8/2010 | Kusano | |
| 2010/0233977 A1 * | 9/2010 | Minnis | H03F 1/0211 455/127.1 |
| 2010/0291888 A1 * | 11/2010 | Hadjichristos | H03F 1/0277 455/127.4 |
| 2010/0321110 A1 * | 12/2010 | Ichitsubo | H03F 3/195 330/144 |
| 2011/0037516 A1 * | 2/2011 | Nejati | H03F 1/565 330/124 R |
| 2011/0065472 A1 * | 3/2011 | Zhu | H03F 1/56 455/552.1 |
| 2011/0156963 A1 * | 6/2011 | Rajgopal | H01P 1/203 343/702 |
| 2011/0234316 A1 * | 9/2011 | Kim | H03F 1/56 330/192 |
| 2011/0241798 A1 * | 10/2011 | Hong | H03H 7/0115 333/175 |
| 2012/0034893 A1 * | 2/2012 | Baxter | H03G 3/3042 455/234.1 |
| 2012/0075023 A1 * | 3/2012 | Guo | H03F 1/0261 330/296 |
| 2012/0188011 A1 * | 7/2012 | Retz | H03F 1/0277 330/144 |

* cited by examiner

Table 2

| Bands |
|---|
| 700-900MHz |
| 1.7-2GHz |
| 2.3-2.5GHz |
| 4.8-5GHz |
| ...... |

Table 1

| Modes | Pout (dBm) | PAE (%) | ACLR (dBc) | EVM (%) | ...... |
|---|---|---|---|---|---|
| WiFi | 17-26 | 30 | | 3 | |
| WiMax | 23 | | | | |
| LTE | 26.5-27 | 35 | | 3 | |
| WCDMA | 28 | 40 | | | |
| GSM | 30-33 | 50-60 | -40 | | |
| CDMA | | | | | |
| CDMA2000 | | | | | |
| EDGE | | | | | |
| ...... | | | | | |

Table 3

| | WiFi | WCDMA | | WCDMA | | GSM | |
|---|---|---|---|---|---|---|---|
| | 2.3-2.5GHz | 700-900MHz | 1.7-2GHz | 700-900MHz | 1.7-2GHz | 700-900MHz | 1.7-2GHz |
| 1st Amplifying Module | 4 | | 6 | 6 | 6 | 8 | 6 |
| 2nd Amplifying Module | | | 12 | 12 | 12 | 10 | 12 |
| 3rd Amplifying Module | | | | | | 20 | 16 |
| Total | 4 | | 18 | 18 | 18 | 44 | 34 |

FIG. 7

MULTI-MODE MULTI-BAND SELF-REALIGNING POWER AMPLIFIER

CROSS-REFERENCE TO RELATED APPLICATIONS

This application is a divisional of U.S. Ser. No. 13/557,173, filed Jul. 24, 2012, titled "MULTI-MODE MULTI-BAND SELF-REALIGNING POWER AMPLIFIER"; which further claims benefit of priority with U.S. Provisional Ser. No. 61/511,114, filed Jul. 24, 2011, titled "MULTI-MODE MULTI-BAND SELF-REALIGNING POWER AMPLIFIER"; the contents of each of which are hereby incorporated by reference.

BACKGROUND OF THE INVENTION

Field of the Invention

This invention relates to power amplifier systems designed for multi-mode multi-band operations and capable of readjusting signal properties in response to perturbations.

Description of the Related Art

Frequency bands and modes associated with various protocols are specified per industry standards for cell phone and mobile device applications, WiFi applications, WiMax applications and other wireless communication applications, and the number of specified bands and modes is increasing as the demand pushes. Examples of the frequency bands and modes for cell phone and mobile device applications are: the cellular band (824-960 MHz) which includes two bands, CDMA (824-894 MHz) and GSM (880-960 MHz) bands; and the PCS/DCS band (1710-2170 MHz) which includes three bands, DCS (1710-1880 MHz), PCS (1850-1990 MHz) and AWS/WCDMA (2110-2170 MHz) bands. Examples for uplink include the frequency ranges of DCS (1710-1785 MHz) and PCS (1850-1910 MHz). Examples for downlink include the frequency ranges of DCS (1805-1880 MHz) and PCS (1930-1990 MHz). Examples of frequency bands for WiFi applications include two bands: one ranging from 2.4 to 2.48 GHz, and the other ranging from 5.15 GHz to 5.835 GHz. The frequency bands for WiMax applications involve three bands: 2.3-2.4 GHZ, 2.5-2.7 GHZ, and 3.5-3.8 GHz. Use of frequency bands and modes is regulated worldwide and varies from country to country. For example, for uplink, Japan uses CDMA (915-925 MHz) and South Korea uses CDMA (1750-1780 MHz). In this document, "modes" refer to WiFi, WiMax, LTE, WCDMA, CDMA, CDMA2000, GSM, and so on; and "bands" or "frequency bands" refer to frequency ranges (700-900 MHz), (1.7-2 GHz), (2.4-2.6 GHz), (4.8-5 GHz), and so on.

Power amplifiers (PAs) are designed to amplify power of radio frequency (RF) signals and are widely used in various RF circuits and devices. In modern communication systems, it is generally preferred that PAs provide high linearity and high efficiency in order to achieve a certain performance level. High efficiency is important for power loss reduction, for example to prolong the battery lifetime of handsets. High linearity is important to maintain the integrity of the signal with minimal distortion. Specifications on PA performances are defined for individual modes and bands per industry standards. These specifications involve properties associated with output signals, such as output power, power added efficiency (PAE), error vector magnitude (EVM), adjacent channel leakage ratio (ACLR) and other performance parameters. PAE is defined as the ratio of the difference between output power and input power to the DC power consumed. The curve showing output power versus input power indicates linearity. Linearity may also be evaluated by EVM, which is a measure of how far the points are from the ideal lattice points, expressed as a percentage. Generally, an EVM diagram illustrates that the fixed lattice points correspond to non-distortion of the signal forms and the distortions are quantized by the deviations from the lattice points. Thus, as linearity improves, the EVM value decreases. The EVM value of 0% corresponds to non-distortion, that is, the output signal from the PA has a perfect copy of the input signal, thereby giving rise to ideal linearity. For example, the linearity specification in terms of EVM is 3% for LTE and WiFi. ACLR is another performance measure for linearity and is specified for CDMA, WCDMA, LTE and WiMAX. It is defined as the ratio of the integrated signal power in the adjacent channel to the integrated signal power in the main channel. ACLR is also referred to as adjacent channel power ratio (ACPR). Transistors are used for the power amplification purposes and may be integrated on a chip. These transistor may be a Metal Semiconductor Field Effect Transistor (MESFET), a Pseudomorphic High Electron Mobility Transistor (pHEMT), a Heterojunction Bipolar Transistor (HBT) or of other suitable technologies.

BRIEF DESCRIPTION OF THE DRAWINGS

The characteristics and advantages of this invention will be more apparent from the following detailed description when read in conjunction with the accompanying drawings, in which:

FIG. 7 shows three tables, Table 1, Table 2 and Table 3: Table 1 tabulates examples of industry specifications for some modes; Table 2 tabulates examples of possible different frequency bands; Table 3 tabulates numbers of transistors in the banks;

DETAILED DESCRIPTION

As communication systems need to support worldwide protocols with different bands and different modes, conventional single-mode, single-band PA architectures may pose rigidity with little reconfiguration possibility and yet occupy a large circuit estate. Furthermore, a communication system with an air interface tends to be affected by changes in conditions such as the presence of a human hand, a head, a metal object and other interference-causing objects placed in the vicinity of an antenna. In such cases, for example, a change in impedance may detune the antenna that can affect the system load; the communication band may be shifted due to the detuning. A conventional system with passive antennas generally is not capable of readjusting its functionality to recover optimum performances. A tunable antenna, for example, can be used to alleviate the perturbed properties by controlling the beam, frequency response, impedance and other antenna characteristics so as to recover the original optimum performances. See, for example, U.S. Pat. Nos. 6,900,773, 7,830,320 and 7,911,402, which describe examples of active tunable antennas. Another way to recover the optimum performances may involve readjusting components and modules in the communication system based on the detuning information from the antenna through, for example, a bidirectional control line. Both the tunable antenna and the adjustable components and modules may be used for increased flexibility.

This document describes implementations of a PA system that can handle multiple modes and multiple bands to replace a conventional PA architecture comprised of single-band, single-mode PAs, and at the same time is capable of adjusting frequency, impedance, output power, and other signal properties. As described herein below, these advanced PA features can be achieved by incorporating banks of transistors with different sizes in combination with adjustable matching modules, and dynamically changing the banks and the matching modules based on the time-varying information about the signals and conditions.

In a conventional communication system, each PA is typically designed to operate for a specific frequency band and for a chosen mode. This scheme provides the ease of designing a narrowband system or a module including multiple narrowband signal paths, as shown in the example below.

Figure 1:
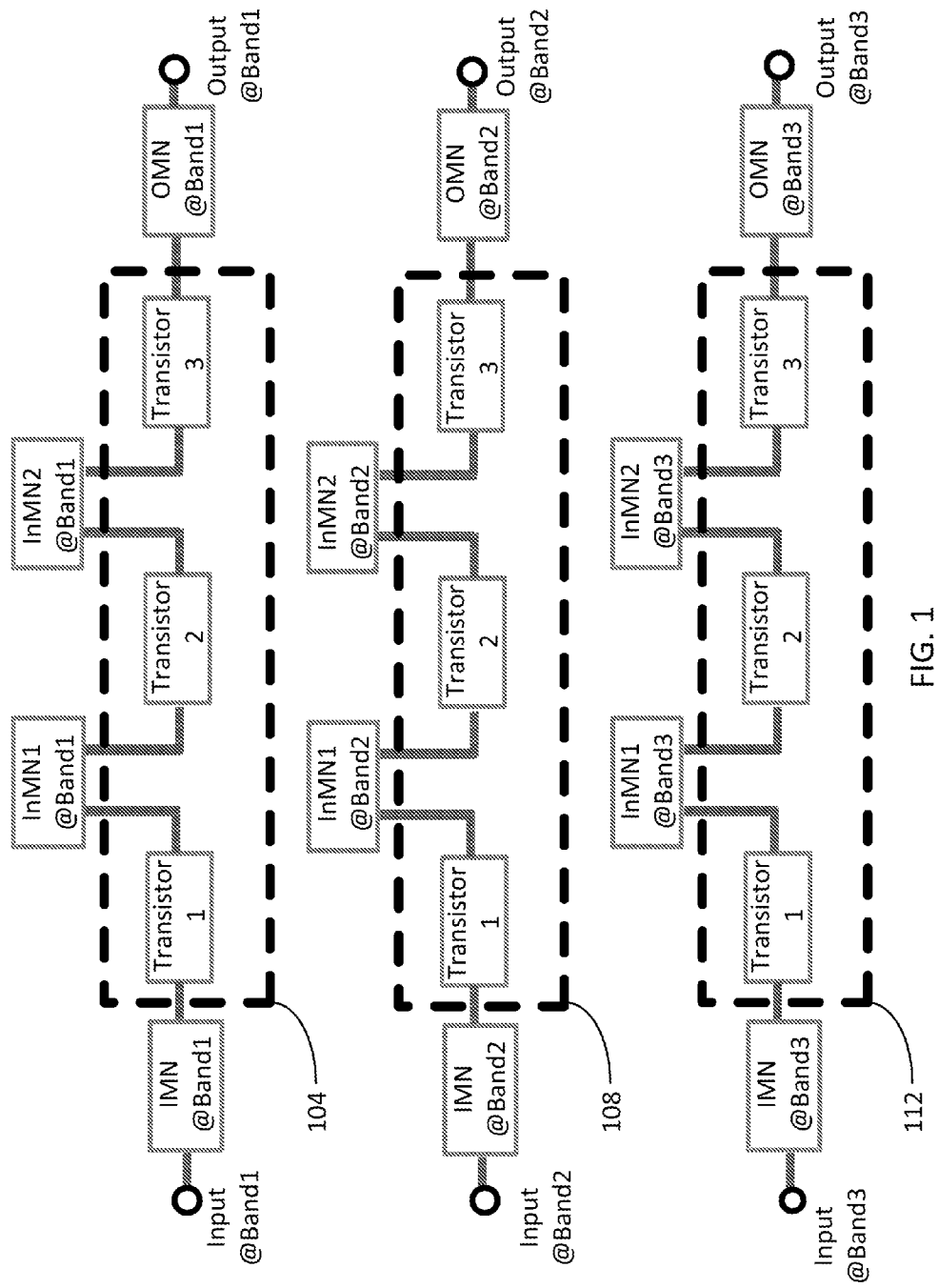
FIG. 1 illustrates an example of a conventional PA structure.

FIG. 1 illustrates an example of a conventional PA structure, wherein matching networks and transistors are configured to operate for respective frequency bands, each with a single mode. This example schematically shows a PA structure adapted for three frequency bands, Band1, Band2, and Band3, having corresponding three different signal paths. Each path carries signals in the specified band with the specified mode. The signals paths for these Band1, Band2 and Band3 are coupled to respective inputs and outputs, i.e., Input@Band1 and Output@Band1, Input@Band2 and Output@Band2, and Input@Band3 and Output@Band3, respectively. Multiple transistors may be integrated on a first chip 104 for Band1, a second chip 108 for Band2, and a third chip 120 for Band3, using a suitable technology as mentioned earlier. This example schematically shows a case of integrating three transistors, labeled Transistor1, Transistor2 and Transistor3 on each chip, with the matching networks for each band attached externally to the chip. Here a "Transistor" may be a group of individual transistors coupled together. An input matching network IMN@Band1, an output matching network OMN@Band1, and two inter-matching networks InMN1@Band1 and InMN2@Band1 are configured for the Band1 signal path. Similarly, an input matching network, an output matching network and two inter-matching networks for a different band are configured for the corresponding signal path. The first inter-matching network InMN1 is coupled between Transistor1 and Transistor2, and the second inter-matching network InMN2 is coupled between Transistor2 and Transistor3 for each signal path. Transistor1 can be used as a driver, followed by a two-stage power amplification realized by Transistor2 and Transistor3.

A power amplifier is one of the most power hungry components in radio frequency (RF) and other communication systems. Accordingly, it is important not only to have PAs with high efficiency but also when a PA is not used to turn it off so as to consume less power without affecting the rest of the system. The power consumption and the chip area can be somewhat reduced by including switches and transistors that can handle signals in multiple bands, as shown in the following example.

Figure 2:
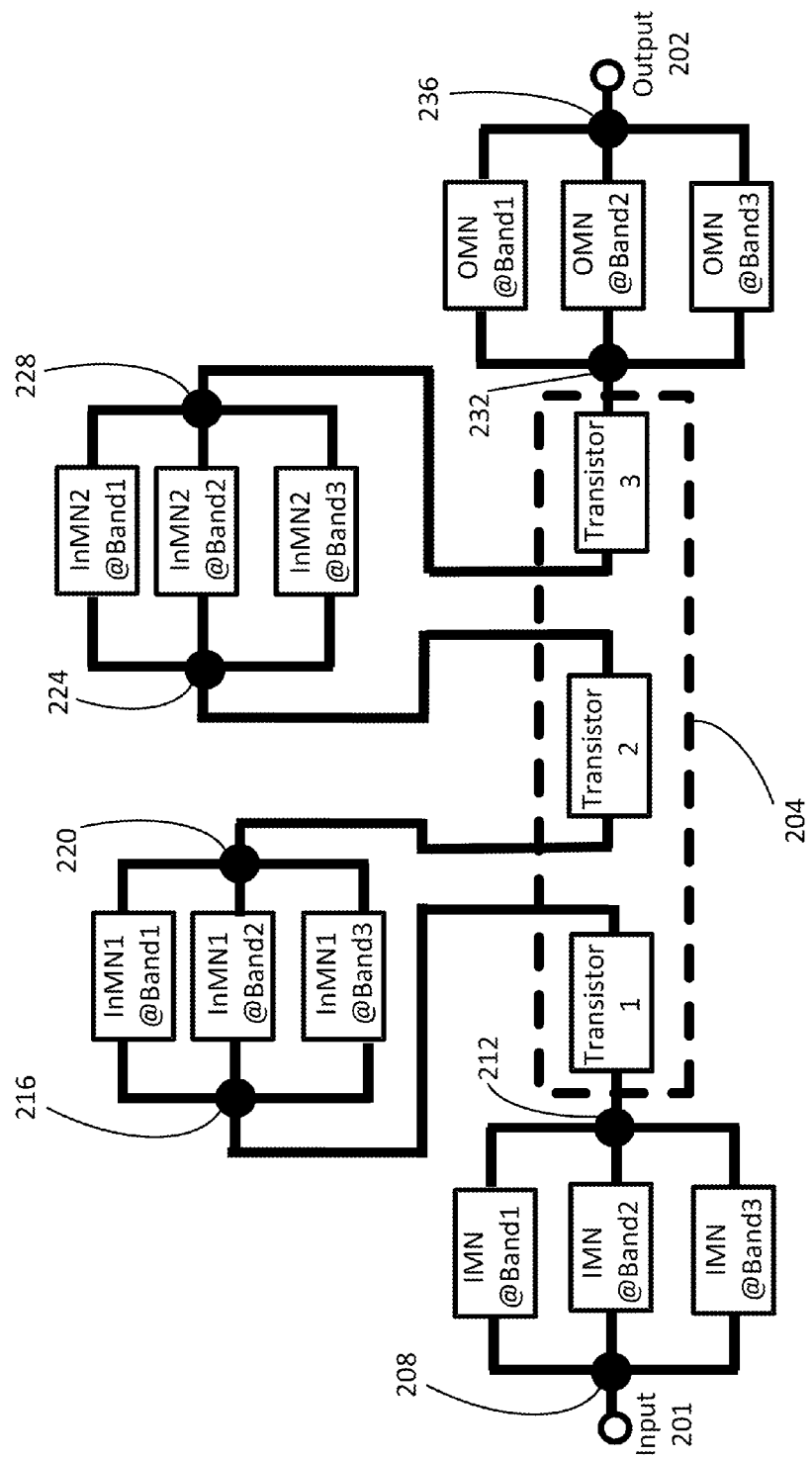
FIG. 2 illustrates another example of a conventional PA structure.

FIG. 2 illustrates another example of a conventional PA structure, wherein matching networks are configured to turn on and off depending on signal frequencies. This example schematically shows a PA structure adapted for three frequency bands, Band1, Band2, and Band3 having corresponding three different signal paths. Each path carries signals in one of the bands in a single mode. These Band1, Band2 and Band3 signal paths are coupled to a common input 201 and a common output 202. Multiple transistors may be integrated on a chip 204 using a suitable technology as mentioned earlier. This example schematically shows a case of integrating three transistors, labeled Transistor1, Transistor2 and Transistor3 on the chip 204, with the matching networks attached externally to the chip. Here, again, a "Transistor" may be a group of individual transistors coupled together. Less chip area may be required in this configuration than in the configuration of FIG. 1 by including transistors in the chip 204 that are capable of handling signals in multiple frequency bands. Input matching networks for the three bands IMN@Band1, IMN@Band2 and IMN@Band3 are coupled in parallel, having a common input point where a switch 208 is placed and a common output point where a switch 212 is placed. First inter-matching networks for the three bands InMN1@Band1, InMN1@Band2 and InMN1@Band3 are coupled in parallel, having a common input point where a switch 216 is placed and a common output point where a switch 220 is placed. Second inter-matching networks for the three bands InMN2@Band1, InMN2@Band2 and InMN2@Band3 are coupled in parallel, having a common input point where a switch 224 is placed and a common output point where a switch 228 is placed. Output matching networks for the three bands OMN@Band1, OMN@Band2 and OMN@Band3 are coupled in parallel, having a common input point where a switch 232 is placed and a common output point where a switch 236 is placed. The first paralleled set of inter-matching network InMN1@Band1, InMN1@Band2 and InMN1@Band3 is coupled between Transistor1 and Transistor2, and the second paralleled set of inter-matching networks InMN2@Band1, InMN2@Band2 and InMN2@Band3 is coupled between Transistor2 and Transistor3. Transistor1 can be used as a driver, followed by a two-stage power amplification realized by Transistor2 and Transistor3.

The switches incorporated as in the configuration of FIG. 2 may be controlled by a controller. For example, when the signal frequency is specified to be in Band1, the switches 208, 212, 216, 220, 224, 228 and 232 may be controlled to turn on and connect the corresponding signal path having IMN@Band1, InMN1@Band1, InMN2@Band1 and OMN@Band1, while turning off to disconnect the other paths. A variation to the switchable configuration may include only one paralleled set of inter-matching networks coupled between two transistors in the chip, adaptable for low power applications.

Figure 3:
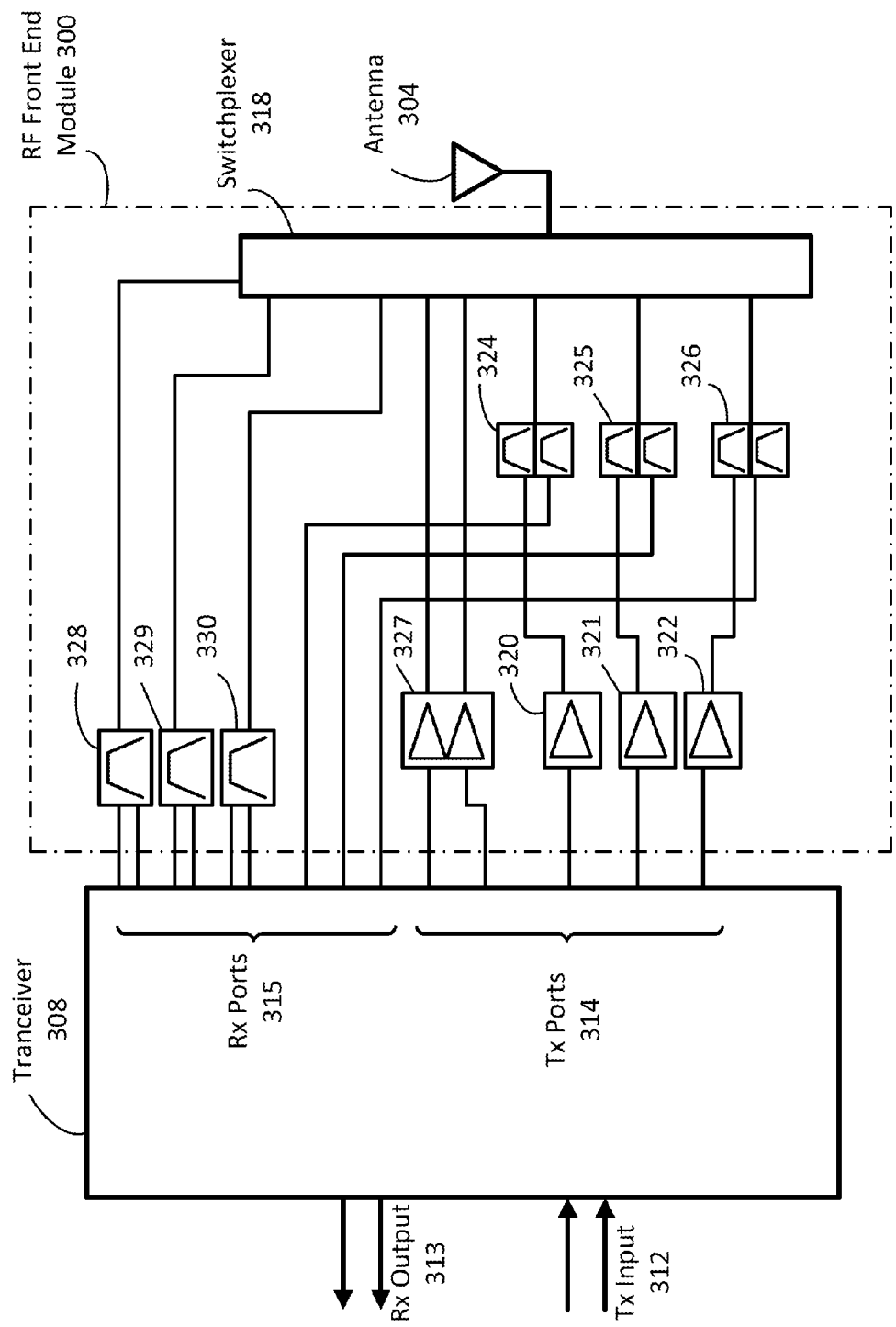
FIG. 3 illustrates an architecture of a conventional communication system.

FIG. 3 illustrates an architecture of a conventional communication system including an RF front end module 300 coupled to an antenna 304 and a transceiver 308. Transmit (Tx) signals are inputted from a Tx input 312 of the transceiver 308, receive (Rx) signals are outputted from an Rx output 313 of the transceiver 308, and these signals are processed by various components and modules configured therein. In this example, the Tx signals have five frequency bands, each with a single mode, e.g., DCS (1805-1880 MHz), PCS (1930-1990 MHz), WiFi (2.4 to 2.48 GHz), etc., and are outputted from respective Tx ports 314 of the transceiver 308. Also in this example, the Rx signals have six frequency bands, three of which have two sub-bands, and the Rx signals in the total of nine bands are inputted to respective Rx ports 315 of the transceiver 308. Generally, Tx signals are lower in frequency than Rx signals within the same nominal band, forming a Tx band lower than an Rx band within the same nominal band. The antenna 304 is coupled to a switchplexer 318 to switch between transmit and receive as well as among different bands and modes. Each PA in this example operates for a single band and a single mode, as in the configuration of FIG. 1. The Tx signals coming out from the lower three ports of the Tx ports 314 are amplified by PAs 320, 321, and 322, respectively, and filtered through duplexers 324, 325, 326, respectively, to reach the antenna 304 through the switchplexer 318 that turns on and connects the corresponding paths. On the other hand, the Rx signals in these three bands are filtered through the duplexers 324, 325 and 326, respectively, and then sent to the lower three ports of the Rx ports 315, respectively. This example in FIG. 3 shows that PAs to amplify the Tx signals coming out of the upper two ports of the Tx ports 314 are integrated on a same chip 327. This example shows that the amplified Tx signals in the two bands reach the switchplexer 318 without a duplexer. Also shown in FIG. 3 are filters 328, 329 and 330, which can receive the Rx signals in three different modes, respectively. In this example, each of the filters 328, 329 and 330 is configured to have a differential output to send the split signals to the Rx ports 315. Generally low noise amplifiers (LNAs) are included in the first stage in a transceiver to receive signals with minimal noise to increase sensitivity and sensibility. A differential LNA provides a better noise figure than a single-ended because of its ability to reject the common-mode noise.

Figure 4:
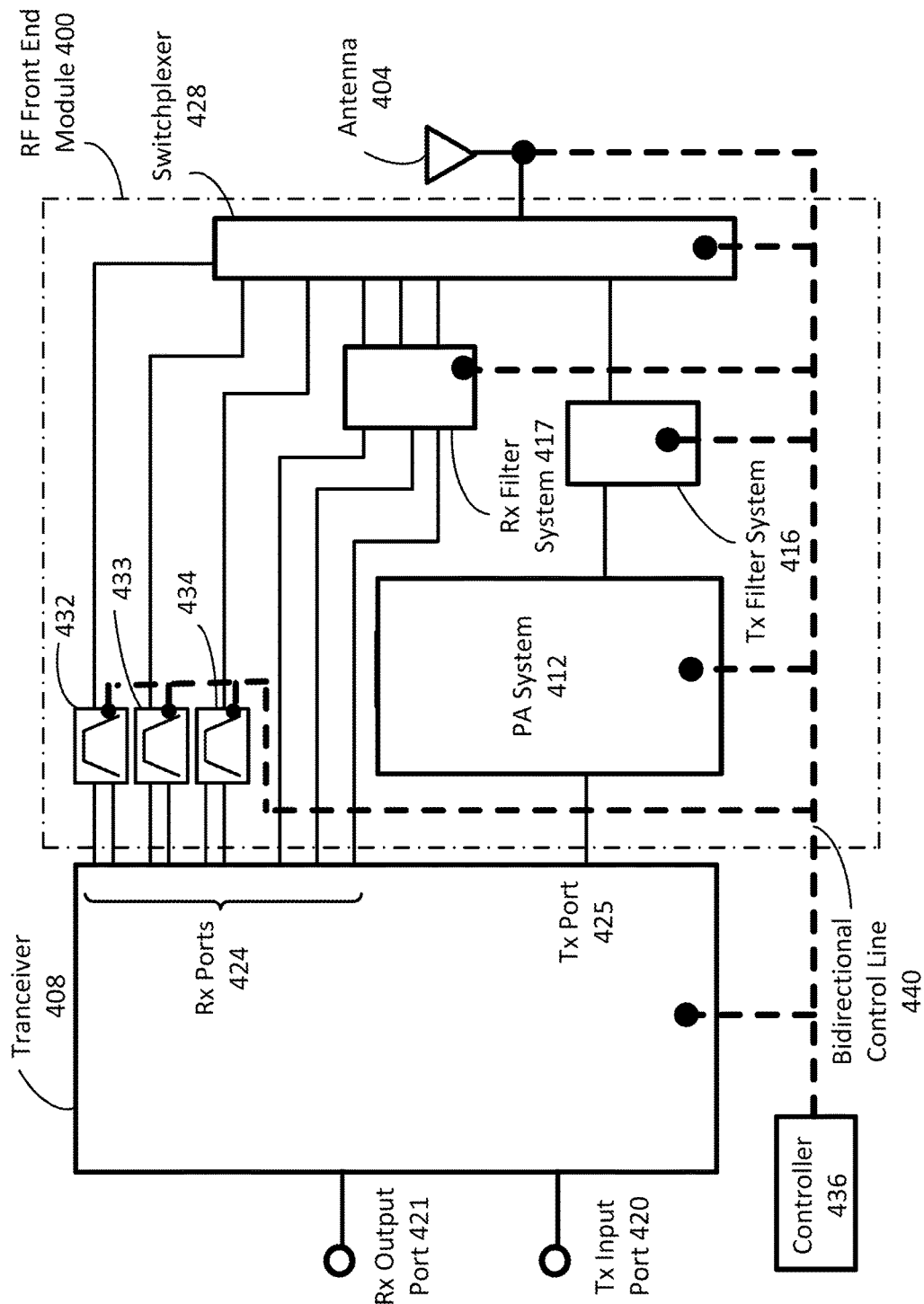
FIG. 4 illustrates an architecture of a communication system, incorporating a PA system that can handle multiple modes and multiple bands.

FIG. 4 illustrates an architecture of a communication system, incorporating a PA system that can handle multiple modes and multiple bands to replace a conventional PA architecture comprised of single-band, single-mode PAs, and at the same time is capable of adjusting frequency, impedance, output power and other properties which once have been perturbed due to changes in conditions. Such a PA system is thus termed a multi-mode multi-band self-realigning PA system in this document. This communication system includes an RF front end module 400 coupled to an antenna 404 and a transceiver 408. A PA system 412 is configured to provide functions as the multi-mode multi-band self-realigning PA system, included in the RF front end module 400, and designed to amplify Tx signals and send the amplified signals to a Tx filter system 416. In the present filter configuration, Rx filters and Tx filters are separated instead of forming duplexers, having the Tx filter system 416 and an Rx filter system 417. As in the conventional case of FIG. 3, the Tx signals are inputted from a Tx input port 420 coupled to the transceiver 408, Rx signals are outputted from an Rx output 421 coupled to the transceiver 408. The Tx signals received at the Tx input port 421 are processed by a Tx section having components and modules coupled to the Tx paths in the system, and transmitted out from the antenna 404; Rx signals are received by the antenna 404 and processed by an Rx section having components and modules coupled to the Rx paths in the system, and outputted from the Rx output port 421. The antenna 404 is configured for both transmit and receive functions for different modes and bands. The antenna 404 in this example is coupled to a switchplexer 428, which is coupled to the Tx section and the Rx section to switch between the Tx section and the Rx section as well as among different bands and modes. Specifically, during a given time interval, the antenna 404 is configured to either transmit or receive signals in a mode selected from the multiple modes and in a frequency band selected from the multiple bands. For example, the Tx signals can be in multiple different frequency bands, each with a single mode, such as mode-and-band combinations of DCS (1805-1880 MHz), PCS (1930-1990 MHz), WiFi (2.4 to 2.48 GHz), etc., and the Tx signals in one of these combinations are sent through a Tx port 425 of the transceiver 408 during the given time interval. Selection of the mode and the band can vary with time; thus, the Tx port 425 sends Tx signals in a different mode and a different band during a different time interval. As in the previous example of FIG. 3, shown in FIG. 4 are filters 432, 433 and 434, which receive the Rx signals in three different modes, respectively. In this example, each of the filters 432, 433 and 434 is configured to have a differential output to send the split signals to the Rx ports 424. Generally LNAs are included in the first stage in a transceiver to receive signals with minimal noise to increase sensitivity and sensibility. A differential LNA provides a better noise figure than a single-ended because of its ability to reject the common-mode noise.

The antenna 404 may be a passive antenna or a tunable antenna. The use of a tunable antenna in combination with the multi-band multi-mode self-realigning PA system may provide increased flexibility in readjusting signal properties as compared to the case of using only such a PA system or a tunable antenna.

Algorithms to control various components are included in a controller 436, which is coupled to the Tx section to adjust properties associated with the Tx signals. The controller 436 in this example is coupled to the PA system 412, the antenna 404, the transceiver 416, and the switchplexer 428 through a bidirectional control line 440. Such control connections can be made to other components in the system and/or components inside of a subsystem or a module. The bidirectional control can be realized, for example, by using an interface specified by the MIPI Alliance. See, for example, a white paper entitled "Tuning Technology: Key Element to Lower Operating Costs While Improving Wireless Network Performance," released on Feb. 8, 2011, by IWPC (International Wireless Industry Consortium). The bidirectional control line 440 can be a conventional bus, wirelessly-connected transmission or other suitable forms. In the communication system of FIG. 4, the controller 436 may be configured to obtain information about the Tx signals from a user selection, a base station and other commanding locations or systems and accordingly control the PA system 412 and other components to select the optimum configuration corresponding to the mode and the band of the Tx signals to meet specifications on properties associated with the Tx signals. Further, the controller 436 controls the PA system and other components variably with time as the information varies to provide the optimum configuration during each time interval. Furthermore, when the antenna 404 gets detuned by changes in conditions, for example, by the presence of a head, a hand or other interference-causing objects in the proximity of the antenna 404, the controller 436 may obtain the detuning information from the antenna 404 and accordingly control the PA system 412 and other components to readjust the affected parameters. For example, the change in impedance and/or the shift in band frequency may be sensed by the antenna 404 and retuned to the optimum state by adjusting the PA system 412 and the Tx filter system 416.

Figure 5:
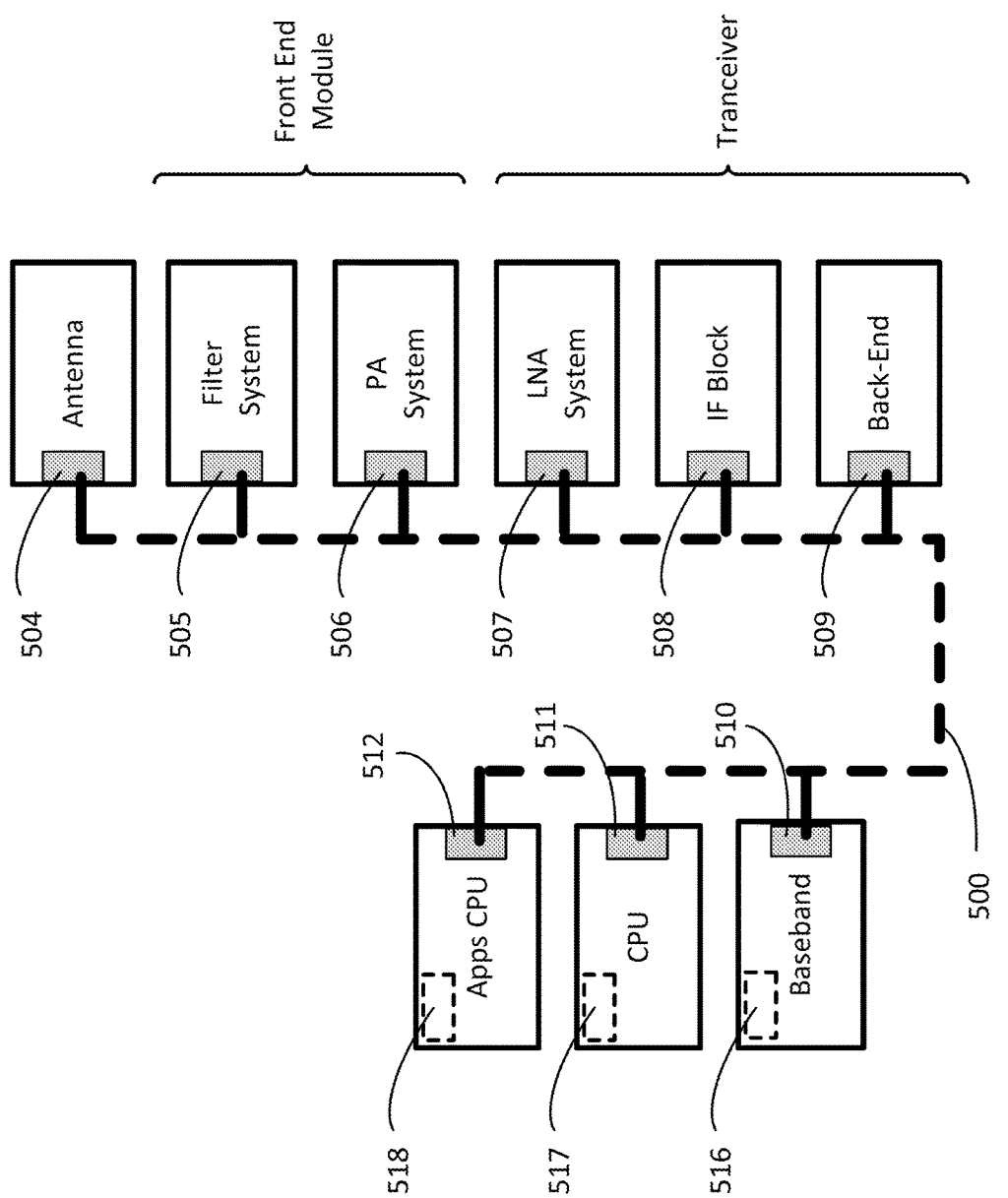
FIG. 5 is a block diagram illustrating a bidirectional control.

For the bidirectional control to work, various components and modules in the communication system as well as components and modules coupled externally to the communication system need to communicate with each other through a bidirectional control line such as 440 of FIG. 4. The bidirectional control may be implemented though a suitable interface scheme such as the one specified by the MIPI Alliances mentioned earlier. FIG. 5 is a block diagram illustrating a bidirectional control, wherein a bidirectional control line 500 is used to couple an antenna, a filter system, a PA system, low-noise filter (LNA) system, an IF block, a back-end, a baseband, a CPU and an Applications CPU (Apps CPU) through interfaces 504, 505, 506, 507, 508, 509, 510, 511 and 512, respectively implemented. The filter system and the PA system are included in the RF front end module, and the LNA system, the IF Block and the back-end may be included in the transceiver. Algorithms controlling these components and modules can be included in the controller that may be placed in the baseband 516, the CPU 517 or the Apps CPU 518.

The present bidirectional control scheme can be extended to a multiple-input multiple-output (MIMO) system, wherein the communication systems such as in FIG. 4 are coupled in parallel with individual inputs/outputs, each communication system handling multiple modes and multiple bands. The spatial placement and orientation of antennas may differ from one another in the MIMO system, giving rise to non-uniform detuning effects. The antennas in the MIMO system tend to interact with each other due to the electromagnetic proximity effects (coupling effects). For example, these antennas have different loadings so that external effects have different loading effects on different antennas primarily because of different coupling effects between antennas. The controller may be configured to couple to the multiple PA systems, the multiple filter systems and the multiple antennas through a bidirectional control line and interfaces in order to retune the antennas one by one by taking the coupling effects into consideration. Therefore, the dynamic retuning becomes particularly important for the MIMO system.

Figure 6:
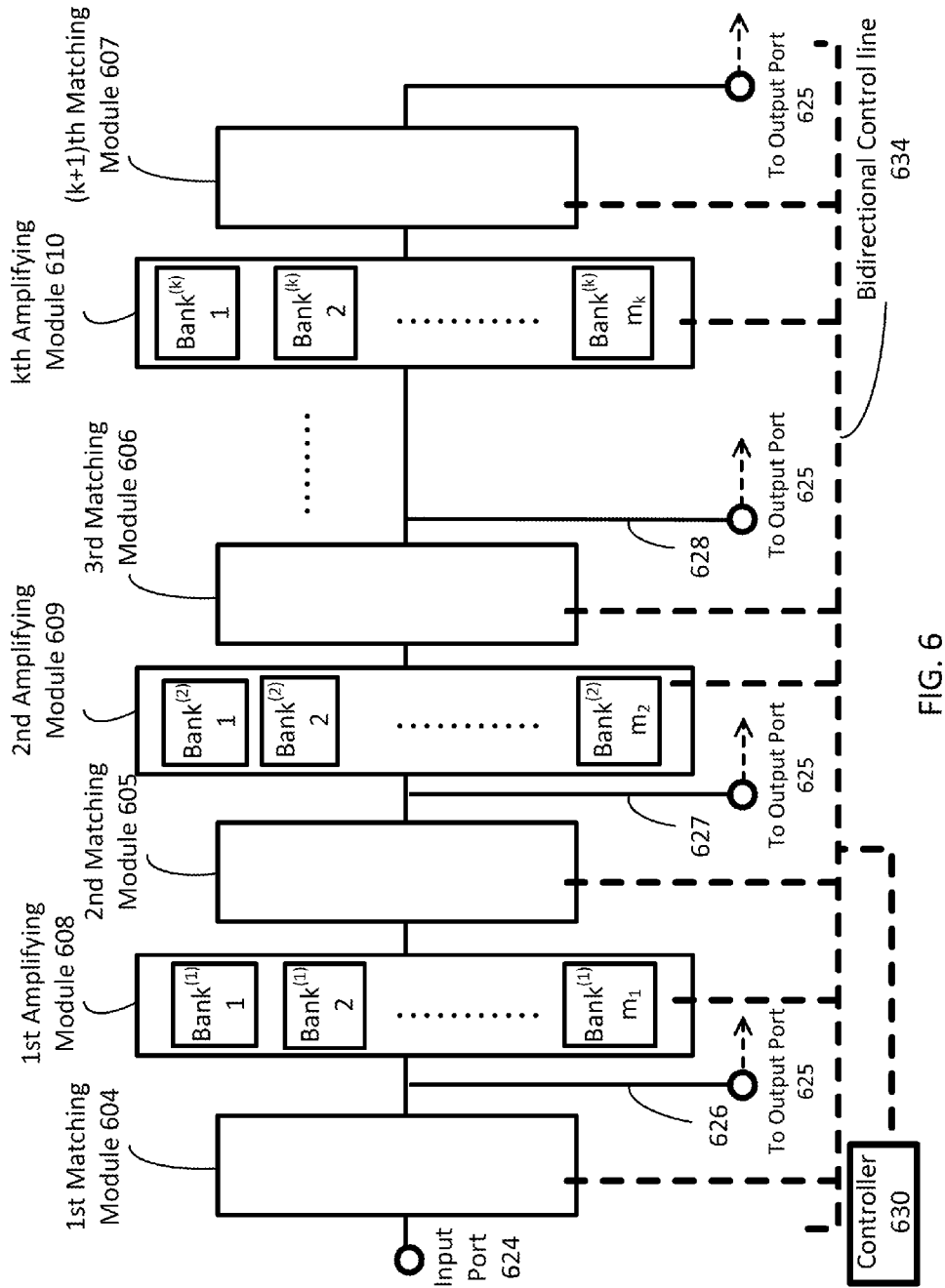
FIG. 6 illustrates a PA system that allows for the dynamic tuning/retuning scheme for multi-mode and multi-band operations.

FIG. 6 illustrates a PA system that allows for the dynamic tuning/retuning scheme for multi-mode and multi-band operations. The PA system is configured to include multiple banks of transistors with different sizes in each power amplifying module as well as multiple matching modules that are designed to provide the optimum impedance for each of multiple frequency bands, allowing to dynamically change the signal path by selecting an optimum series of banks and adjusting the matching modules. Specifically, the PA system of FIG. 6 includes the first matching module 604, the second matching module 605, the third matching module 606 . . . and the $(k+1)^{th}$ matching module 607, and the first amplifying module 608, the second amplifying module 609 . . . and the $k^{th}$ amplifying module 610. Each matching module is configured to be adjustable to provide the optimum impedance for a specified frequency band and given conditions. Each amplifying module includes one or more banks, each bank including one or more transistors connected to have a common input terminal such as a gate or a base. These banks in the amplifying module are sized differently to amplify power of signals to different predetermined levels. Generally, the larger the size is, the larger the power amplifying level is. Thus, one or more banks in the amplifying module can provide one or more different power levels. The number of banks in each amplifying module may vary from module to module as denoted by m1, m2 . . . and mk in the figure. The number of matching modules, (k+1), is one more than the number of amplifying modules, k, and they are coupled alternately in series having the first matching module 604 coupled to an input port 624 and the $(k+1)^{th}$ matching module 607 coupled to an output port 625. The first matching module 604 may serve as an input matching network, and the first amplifying module may provide driver transistors. In cases where the output power of output signals varies, the number of amplifying modules can also vary to provide variable number of amplifying stages. The output signals can thus be outputted at an earlier stage, such as taking an output line 626, 627 or 628 to the output port 625, by turning off the subsequent amplifying modules and matching modules.

A controller 630 can be configured to control the matching modules, the power amplifying modules, and components therein including the input terminal such as a gate or a base of each bank. A bidirectional control line 634 can be configured to connect the controller 630, the matching modules 604, 605, . . . and 607 and components therein, the power amplifying modules 608, 609, . . . and 610 and components therein, an antenna and other components or modules. The controller 630 can be configured also to receive information about output signals and conditions via the bidirectional control line 634. Such information may be received from a user selection, a base station, or other commanding locations or systems. Such information may also be obtained from the antenna coupled to a communication system where the PA system resides. The information can vary with time as the signals and conditions vary. Based on the information the controller 630 can adjust each of the matching modules 604-607 to provide the optimum impedance for the specified frequency band and the given conditions during a given time interval. Furthermore, based on the information the controller 630 can control the input terminal (a gate or a base) of each bank to turn on a series of banks, by selecting one bank from each amplifying module in a predetermined series to provide an optimum power amplifying level for the mode and the frequency band specified during the given time interval. As a result, these adjusted matching modules and the selected banks are coupled alternately in series to provide an optimum signal path having the first matching module 604 coupled to the input port 624 and also having a last matching module, which receives signals from the last bank in the series, coupled to the output port 625. Since the information on the signals and conditions can vary with time, the adjustment of the matching modules and the selection of banks can vary with time to meet specifications of properties of the output signals during each time interval. That is, the controller 630 can adjust the matching modules and control the input terminals of banks variably with time according to the time-varying information. The number of selected banks in the series can be less than or equal to the total number of amplifying modules, k; and correspondingly the number of matching modules in the optimum signal path can be less than or equal to the total number of sets of MNs, (k+1). The output signals may thus be outputted at an earlier stage, such as taking the output line 626, 627 or 628 to the output port 625. For example, each mode needs a certain output power to meet the industry specifications. Therefore, the selection of banks for the optimum series is made to meet the output power requirement for the selected mode and band. Accordingly, if the power level is allowed to be lower, such as in the WiFi mode, the number of banks in the optimum series can be less than the total number of amplifying modules, k. In any case, the sequence of the optimum signal path having the adjusted matching modules and the selected banks has the first matching module serving as an input matching network coupled to the input port 624 and the last matching module serving as an output matching network coupled to the output port 625.

Industry specifications for each mode are published in terms of not only output power, but also efficiency, linearity and other properties. The optimum series of banks and matching modules for each mode and band may be predetermined to meet the industry specifications based on nominal conditions. The controller 630 can then be configured to control the matching modules and the input terminals (gates/bases) of the banks to dynamically change the signal path according to the time-varying information it receives. The present PA system of FIG. 6 is thus capable of dynamically providing an optimum signal path by selecting a series of banks, adjusting each of the matching modules and coupling them alternately in series to meet the specified properties of output signals. Such flexibility in the present scheme is provided by having the differently sized banks and the matching modules designed to be adjustable.

When the antenna gets detuned by perturbations such as the presence of a head, a hand or other interference-causing objects, the controller 630 obtains information on the perturbed output signals from the antenna and control the modules and components in the PA system to readjust the affected parameters. For example, the change in impedance may be sensed by the antenna, and the information is sent to the controller 630 via the bidirectional control line 634. The controller 630 then adjusts the matching modules to recover the impedance. For another example, the change in frequency of the output signals may be sensed by the antenna, and the information is sent to the controller 630. The controller then adjusts the matching modules to recover the frequency band and also controls the input terminals of the banks to turn on a series of banks to recover the power amplifying level for the frequency band. Perturbations to nominal conditions include a distance to a base station. For example, when the system is close to the base station and the output power does not have to be high, the PA system does not have to amplify the power level significantly. Accordingly, the controller 630 controls the input terminals of the banks to turn on less number of banks in the series than when the system is in a nominal range from the base station, thereby outputting less output power.

FIG. 7 shows three tables, Table 1, Table 2 and Table 3. Table 1 tabulates examples of industry specifications for some modes such as WiFi, WiMax, LTE, WCDMA, GSM, CDMA, CDMA 2000 and EDGE. The specifications are established for properties of output signals in each mode using characteristic parameters such as output power (Pout), efficiency (PAE), and linearity (ACLR, EVM), etc. Each mode may have one or more frequency bands. Table 2 tabulates examples of possible different frequency bands.

Banks of transistors in a PA system can be sized differently to provide different power levels, linearity and other properties. The size of a bank is typically determined by the number of transistors, the number of fingers of an input terminal (a gate or a base) of the bank, and overall length and width of the transistor. These transistors may be a Metal Semiconductor Field Effect Transistor (MESFET), a Pseudomorphic High Electron Mobility Transistor (pHEMT), a Heterojunction Bipolar Transistor (HBT) or of other suitable technologies. Table 3 in FIG. 7 tabulates numbers of transistors in the banks by fixing the other parameters as a measure representing the sizes of prefabricated banks. Table 3 shows an example in which the first amplifying module has three banks with the numbers of transistors 4, 6 and 8, respectively, the second amplifying module has two banks with the number of transistors 12 and 16, and the third amplifying module has two banks with the number of transistors 16 and 20, respectively. Assuming nominal loads and other nominal conditions, the optimum series of banks can be predetermined for each combination of a mode and a band to meet the specifications. That is, the optimum series of banks for the WiFi (2.3-2.5 GHz) has the bank of 4 transistors selected from the first amplifying module and the banks in the subsequent amplifying modules are turned off; the optimum series of banks for the WCDMA (700-900 MHz) and WCDMA (1.7-2 GHz) has the bank of 6 transistors selected from the first amplifying module, the bank of 12 transistors selected from the second amplifying module and the banks in the subsequent amplifying modules are turned off; the optimum series of banks for the GSM (700-900 MHz) has the bank of 8 transistors selected from the first amplifying module, the bank of 16 transistors selected from the second amplifying module and the bank of 20 transistors selected from the third amplifying module; and the optimum series of banks for the GSM (1.7-2 GHz) has the bank of 6 transistors selected from the first amplifying module, the bank of 12 transistors selected from the second amplifying module and the bank of 16 transistors selected from the third amplifying module.

Figure 8:
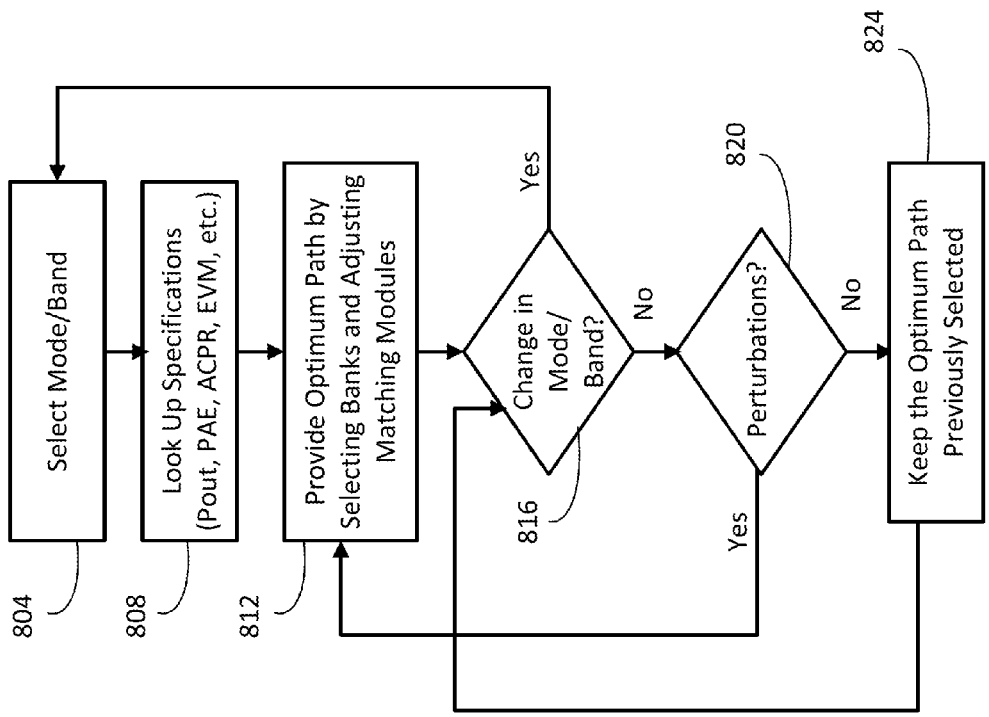
FIG. 8 illustrates a process flow of an algorithm to operate the PA system.

FIG. 8 illustrates a process flow of an algorithm to operate the PA system. In the first step 804, the system selects the combination of a frequency band and a mode depending on information from, e.g., a user selection, a base station, or other commanding locations or systems. In the next step 808, the system obtains specifications for the selected band and mode in terms of output power, efficiency, and linearity and other properties. These specifications can be tabulated in terms of Pout, PAE, ACPR, EVM, etc. in a lookup table format, as in Tables 1 and 2, for example, which may be loaded onto the controller beforehand. Assuming certain nominal conditions, such as loads and a distance to the base station, in the next step 812, the system provides the optimum signal path by selecting banks from the amplifying modules and adjusting the matching modules. In the next step 816, the system checks if a different combination of a mode and a band is specified, for example, by a user entering a foreign country that uses a different protocol for communications. If "Yes," the system goes back to the initial step 804 to select the new mode and the new band, and follow the same process. If "No," the system still keeps the optimum signal path for the originally selected mode and band, but the system checks if there are any perturbations caused by changes in conditions, such as a change in output power due to the change in distance to the base station, frequency shift and/or impedance change caused by the presence of an interference-causing object in the proximity of the antenna, and so on. If "Yes," the system goes back to the step 812 to seek for an optimum signal path by selecting banks from the amplifying modules and adjusting the matching modules. If there is no perturbation, the system keeps the optimum signal path previously selected as in the step 824, but keeps monitoring if there are any perturbations or changes in selection of a mode and a band.

Figure 9:
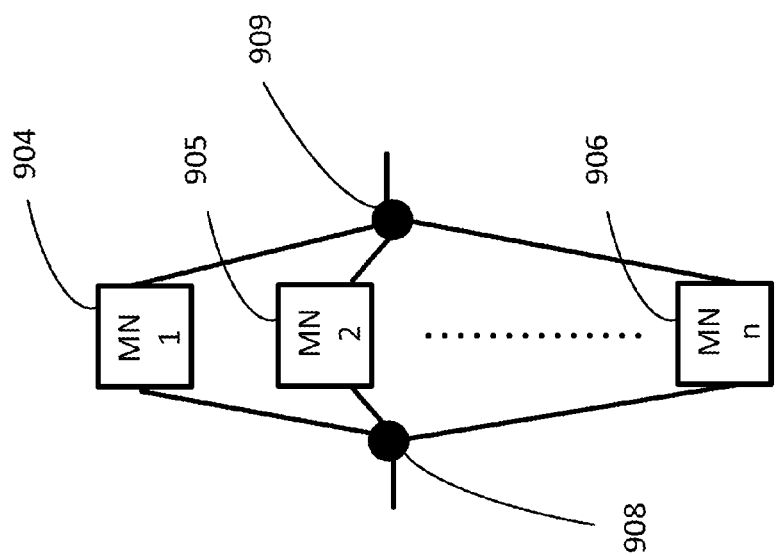
FIG. 9 illustrates a first example of the matching module that can be implemented in the PA system of FIG. 6.

FIG. 9 illustrates a first example of the matching module that can be implemented in the PA system of FIG. 6. This matching module includes multiple matching networks (MNs) 904, 905 . . . 906, denoted by MN1, MN2 . . . , and MNn, respectively in the figure, coupled in parallel with a first common end coupled to a first switch 909 and a second common end coupled to a second switch 909. The multiple matching networks (MNs) are configured to provide an impedance value suitable for each of the frequency bands. The controller, such as the controller 630 in FIG. 6, can control the switches 908 and 909 to select one of the MNs designed to provide the optimum impedance for a specified frequency band during a given time interval. Each of the MNs may include one or more tunable components that can be controlled by the controller to further adjust the impedance. When the antenna in the communication system in which the PA system resides senses the deviation of impedance from a nominal value, for example, 50Ω, the controller receives the information from the antenna through the bidirectional control line, such as the bidirectional control line 634 of FIG. 6. Based on the information the controller can control the tunable components to adjust the impedance.

Figure 10:
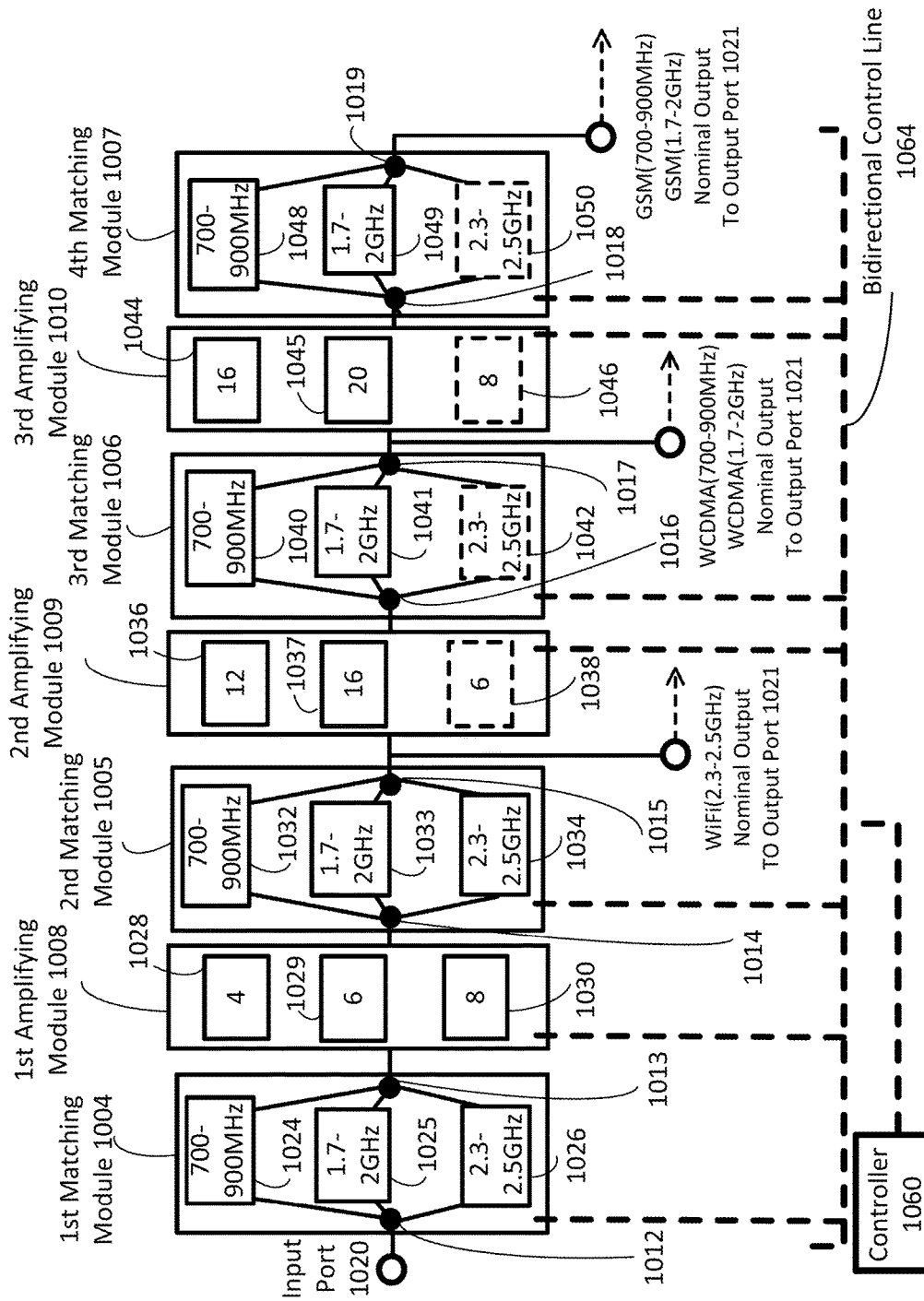
FIG. 10 illustrates a PA system including the first example of the matching module of FIG. 9.

FIG. 10 illustrates a PA system including the first example of the matching module of FIG. 9. This PA system is configured to provide the optimum signal path for WiFi (2.3-5 GHz), WCDMA (700-900 MHz), WCDMA (1.7-2 GHz), GSM (200-900 MHz) and GSM (2.7-2 GHz) under nominal conditions, such as nominal loads and a nominal distance to a base station, as exemplified in Table 3. This PA system includes the first matching module 1004, the second matching module 1005, the third matching module 1006 and the fourth matching module 1007, and the first amplifying module 1008, the second matching module 1009 and the third matching module 1010. These matching modules and amplifying modules are coupled alternately in series having the first matching module 1004 being coupled to an input port 1020 and the fourth matching module 1007 being coupled to an output port 1021. The matching modules 1004 includes three MNs 1024, 1025 and 1026 designed for three frequency bands (700-900 MHz), (1.7-2 GHz) and (2.3-2.5 GHz), respectively. The first amplifying module 1008 includes three banks 1028, 1029 and 1030 sized with 4 transistors, 6 transistors and 8 transistors, respectively. The second matching module 1005 includes three MNs 1032, 1033 and 1034 designed for three frequency bands (700-900 MHz), (1.7-2 GHz) and (2.3-2.5 GHz), respectively. The second amplifying module 1009 includes two banks 1036 and 1037 sized with 12 transistors and 16 transistors, respectively, and optionally includes the third bank 1038 sized with 6 transistors. The third matching module 1006 includes two MNs 1040 and 1041 designed for two frequency bands (700-900 MHz) and (1.7-2 GHz), respectively, and optionally includes the third MN 1042 for the frequency band (2.3-2.5 GHz). The third amplifying module 1010 includes two banks 1044 and 1045 sized with 16 transistors and 20 transistors, respectively, and optionally includes the third bank 1046 sized with 8 transistors. The fourth matching module 1007 includes two MNs 1048 and 1049 designed for two frequency bands (700-900 MHz) and (1.7-2 GHz), respectively, and optionally includes the third MN 1050 for the frequency band (2.3-2.5 GHz).

The controller 1060 is configured to receive information about output signals via a bidirectional control line 1064. Such information may be received from a user selection, a base station, or other commanding locations or systems. Such information may also be obtained from an antenna coupled to the communication system where the PA system resides. The information can vary with time as the output signals vary. Based on the information, the controller 1060 controls the switches 1012-1019 to turn on a series of MNs, by selecting one MN from each matching module in a predetermined series to provide the optimum impedance for the frequency band specified during the given time interval. Each of the MNs may include one or more tunable components that can be controlled by the controller to further adjust the impedance. Furthermore, based on the information the controller 1060 controls the input terminal (a gate or a base) of each bank to turn on a series of banks, by selecting one bank from each amplifying module in a predetermined series to provide an optimum power amplifying level for the mode and the frequency band specified during the given time interval. The selected MNs and the selected banks are coupled alternately in series to provide an optimum signal path having the first MN coupled to the input port 1020 and the last MN coupled to the output port 1021. According to Table 3, for the WiFi (2.3-2.5 GHz), the controller 1060 selects the MN 1026 with the (2.3-2.5 GHz) design from the first matching module 1004, the bank 1028 with 4 transistors from the first amplifying module 1008, and the MN 1034 with the (2.3-2.5 GHz) design from the second matching module 1005 and coupled them alternately in series, thereby realizing the optimum path for the WiFi (2.3-2.5 GHz) under nominal conditions. The WiFi (2.3-2.5 GHz) signals are sent to the output port 1021 from the switch 1015. According to Table 3, for the WCMA, the controller 1060 selects the bank 1029 with 6 transistors from the first amplifying module 1008 and the bank 1036 with 12 transistors from the second amplifying module 1009 for both (700-900 MHz) and (1.7-2 GHz) bands. Further, the controller 1060 selects the MN 1024 with the (700-900 MHz) design from the first matching module 1004, the MN 1032 with the (700-900 MHz) design from the second matching module 1005 and the MN 1040 with the (700-900 MHz) design from the third matching module 1006 for the WCDMA (700-900 MHz); and the MN 1025 with the (1.7-2 GHz) design from the first matching module 1004, the MN 1033 with the (1.7-2 GHz) design from the second matching module 1005 and the MN 1041 with the (1.7-2 GHz) design from the third matching module 1006 for the WCDMA (1.7-2 GHz). The WCDMA signals are sent to the output port 1021 from the switch 1017. According to Table 3, for the GSM (700-900 MHz), the controller 1060 selects the bank 1030 with 8 transistors from the first amplifying module 1008, the bank 1037 with 16 transistors from the second amplifying module 1009 and the bank 1045 with 20 transistors from the third amplifying module 1010, the MN 1024 with the (700-900 MHz) design from the first matching module 1004, the MN 1032 with the (700-900 MHz) design from the second matching module 1005, the MN 1040 with the (700-900 MHz) design from the third matching module 1006, and the MN 1048 with the (700-900 MHz) design from the fourth matching module 1007. According to Table 3, for the GSM (1.7-2 GHz), the controller 1060 selects the bank 1029 with 6 transistors from the first amplifying module 1008, the bank 1036 with 12 transistors from the second amplifying module 1009 and the bank 1044 with 16 transistors from the third amplifying module 1010, the MN 1025 with the (1.7-2 GHz) design from the first matching module 1004, the MN 1033 with the (1.7-2 GHz) design from the second matching module 1005, the MN 1041 with the (1.7-2 GHz) design from the third matching module 1006, and the MN 1049 with the (1.7-2 GHz) design from the fourth matching module 1007. The GSM signals are sent to the output port 1021 from the switch 1019.

Information on perturbations from the nominal conditions can be detected and sent to the controller 1060. The controller 1060 then controls the components in the PA system to adjust the affected parameters to recover the specified properties of the output signals. For example, when the system is far away from the base station and more output power than the nominal condition is needed, the optional bank 1038 with 6 transistors in the second amplifying module 1009 may be added in the series to increase the power level for the WiFi (2.3-2.5 GHz). Correspondingly, the optional MN 1042 with the (2.3-2.5 GHz) design in the third matching module 1006 may also be added as the output matching network to send the output signals from the switch 1017 to the output port 1021, instead of from the switch 1015. Similarly, when the base station is close by and the output power level is high, the signal path for the WCDMA may not have to include the bank 1036 with 12 transistors in the second amplifying module 1009, since the power amplification by the bank 1029 with 6 transistors in the first amplifying module 1008 may be enough to meet the specification. The controller 1060 thus turns off the bank 1036 and disconnects the third matching module 1006 to shorten the signal path and send the WCDMA output signals from the switch 1015, instead of from the original switch 1017, to the output port 1021. Another example of perturbation is the change in impedance that can be detected by the antenna. Upon receiving the information, the controller 1060 can control the tunable components in the MNs already in the signal path to further adjust the impedance. Yet another example of perturbation is a frequency shift as detected by the antenna. Upon receiving the information, the controller 1060 can control the switches and the input terminals (gates/bases) of the banks to provide the optimum path by selecting MNs and banks for the specified frequency band.

Figure 11:
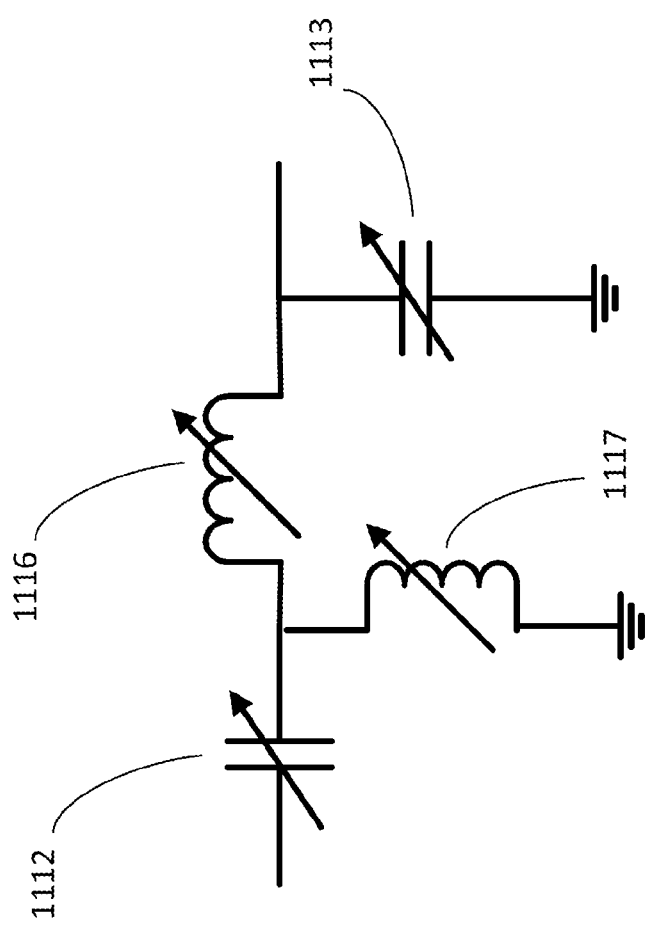
FIG. 11 illustrates a second example of the matching module that can be implemented in the PA system of FIG. 6.

Instead of coupling multiple MNs designed for different frequency bands in parallel to configure the matching module as in the previous case, tunable components may be used in the matching module to cover multiple frequency bands as well as to adjust the impedance. FIG. 11 illustrates a second example of the matching module that can be implemented in the PA system of FIG. 6. Both frequency and impedance can be adjusted by this tunable matching module. Such a tunable matching module is configured to include inductors and capacitors, wherein one or more components can be tunable and can be controlled by the controller. The components, tunable or not, in the matching module can be configured in series, in shunt, in a combination of both or in other suitable circuit configurations or topologies. Examples of tunable capacitors include a varactor, and examples of tunable inductors include a MEMS tunable inductor. The tunable matching module of FIG. 11 is one specific example of having two tunable capacitors 1112 and 1113 and two tunable inductors 1116 and 1117 in the series-shunt configuration. The number of components as well as the circuit configuration or topology depends on the design for targeted frequency and impedance ranges and other design considerations. The controller controls these tunable components to dynamically provide the optimum impedance for the specified band and the conditions that can vary with time.

Figure 12:
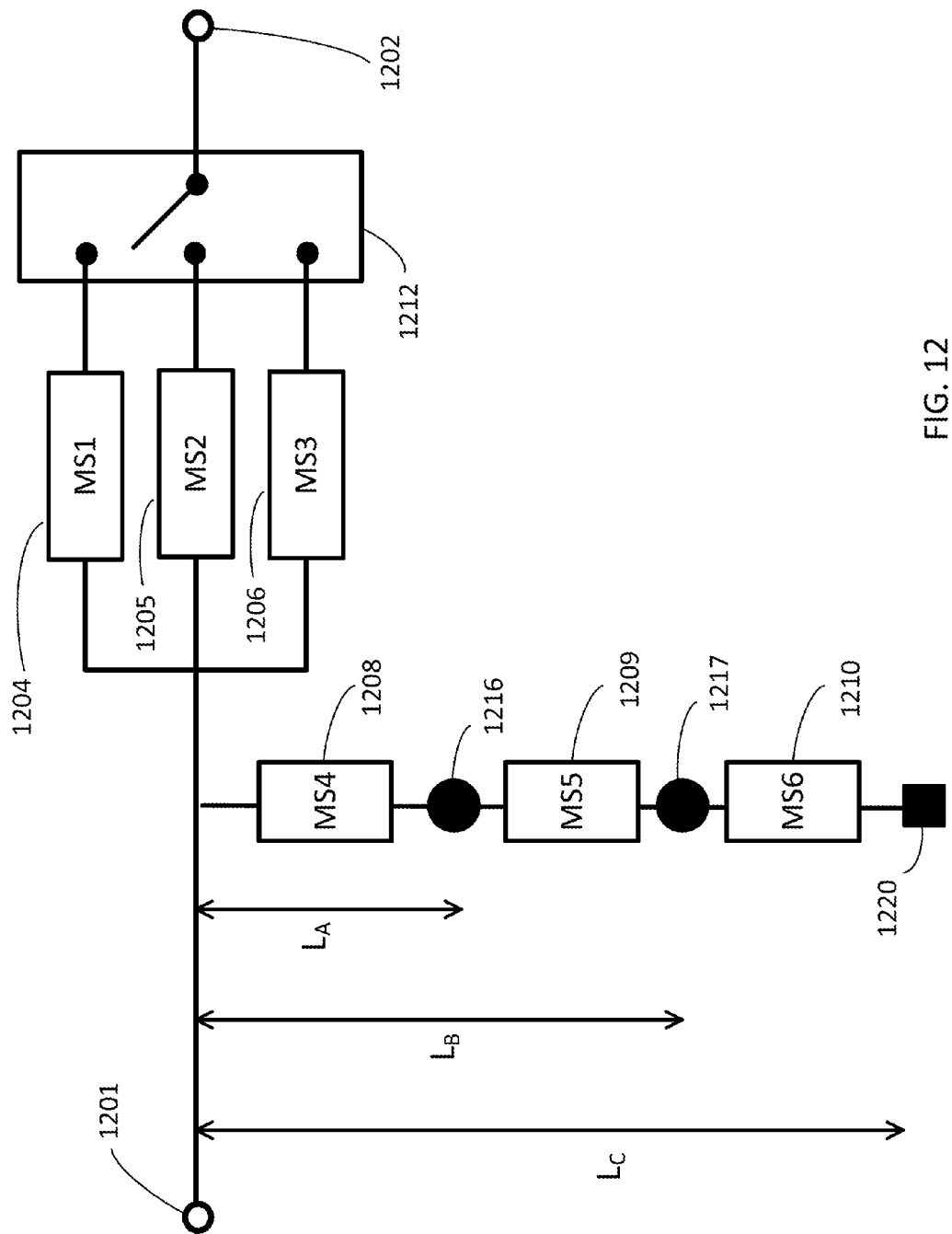
FIG. 12 illustrates a third example of the matching module that can be implemented in the PA system of FIG. 6.

FIG. 12 illustrates a third example of the matching module that can be implemented in the PA system of FIG. 6. The two end portions of the matching module, a first port 1201 and a second port 1202, are used to implement the matching module in the PA system to have the first port 1201 for inputting the signals and the second port 1202 for outputting the signals or to have the first port 1201 for outputting the signals and the second port 1202 for inputting the signals. This matching module includes a first set of multiple microstrips 1204, 1205 and 1206, denoted by MS1, MS2 and MS3 in the figure, respectively, which are coupled in parallel, and a second set of multiple microstrips 1208, 1209 and 1210, denoted by MS4, MS5 and MS6 in the figure, respectively, which are coupled in series. Although three microstrips are used in each of the first set and the second set in this example, the number of microstrips can be different depending on the number of frequency bands, size considerations and other factors. The first set is coupled in series with the signal path by connecting one end of each of the microstrips to the signal path and the other end of each of the microstrips to a switch 1212. The three microstrips 1208, 1209 and 1210 in the second set are coupled alternately in series with switches 1216 and 1217 in between to form a shunt stub, which is coupled in shunt with the signal path by having one end connected to the signal path and the other end 1220 being either ground or open.

The controller in the PA system can be configured to control the switches 1212, 1216, 1217 and 1210. The switch 1212 is controlled to select one of the microstrips 1204, 1205 and 1206 in the first set depending on the frequency of the signal. The switches 1216 and 1217 are controlled to adjust the electrical length depending on the frequency band of the signal. For example, the electrical length of LA is provided by selecting only the microstrip 1208, MS4; the electrical length of LB is provided by selecting the microstrips 1208 and 1209, MS4 and MS5; and the electrical length of LC is provided by selecting the microstrips 1208, 1209 and 1210, MS4, MS5 and MS6. Each of these electrical lengths is designed to provide a desired imaginary part of impedance for a specified band, and each of the microstrips 1204, 1205 and 1206 in the first set is designed to provide a desired real part of impedance for a specified band. Impedance is related to the phase of a signal wave, which is a function of frequency. The imaginary part of impedance is related to the electrical length. Thus, the higher the frequency is, the shorter the electrical length is. Impedance Z and phase Φ are related by the following relationship:

$$Z=\text{Real}(Z)+j\,\text{Imaginary}(Z)=\exp(j\Phi). \qquad \text{Eq. (1)}$$

See for example, U.S. Pat. No. 7,839,236, entitled "Power Combiners and Dividers Based on Composite Right and Left Handed Metamaterial Structures," for the description of microstrip designs based on the impedance transformation, the phase-versus-frequency relationship and other techniques. Thus, by selecting the combination of a microstrip from the first set and one or more microstrips in a series from the second set, the desired impedance can be provided for the specified band during a given time interval. For example, for a band A with a central frequency of fA, the microstrip 1204, MS1, from the first set and the microstrip 1208, MS4, from the second set can be selected to provide the optimum impedance for the band A; for a band B with a central frequency of fB, the microstrip 1205, MS2, from the first set and the microstrips 1208 and 1209, i.e., MS4 and MS5, from the second set can be selected to provide the optimum impedance for the band B; and for a band C with a central frequency of fC, the microstrip 1206, MS3, from the first set and the microstrips 1208, 1209 and 1210, i.e., MS4, MS5 and MS6, from the second set can be selected to provide the optimum impedance for the band C. Here, the values of the frequencies are in the order of fA>fB>fC corresponding to LA<LB<LC. Furthermore, one or more tunable components may be included in each of the microstrips. The comptroller can be configured to control the tunable components to further adjust the impedance.

The phase-versus-frequency relationship differ significantly in a right handed (RH) material, a left handed (LH) material and a composite right and left handed (CRLH) material. RH materials are naturally occurring materials such as microstrips, whereas LH materials and CRLH materials are called metamaterials that are artificially structured. The propagation of electromagnetic waves in RH materials obeys the right-hand rule for the (E, H, β) vector fields, where E is the electric field, B is the magnetic field and β is the wave vector (or propagation constant). LH materials have a negative index of reflection with simultaneously negative permittivity and permeability, with the (E, H, β) following the left-hand rule. See, for example, Caloz and Itoh, "Electromagnetic Metamaterials: Transmission Line Theory and Microwave Applications," John Wiley & Sons (2006). See also, for example, U.S. Pat. No. 7,839,236, entitled "Power Combiners and Dividers Based on Composite Right and Left Handed Metamaterial Structures," for the description of CRLH designs based on the impedance transformation, the phase-versus-frequency relationship and other techniques.

Figure 13:
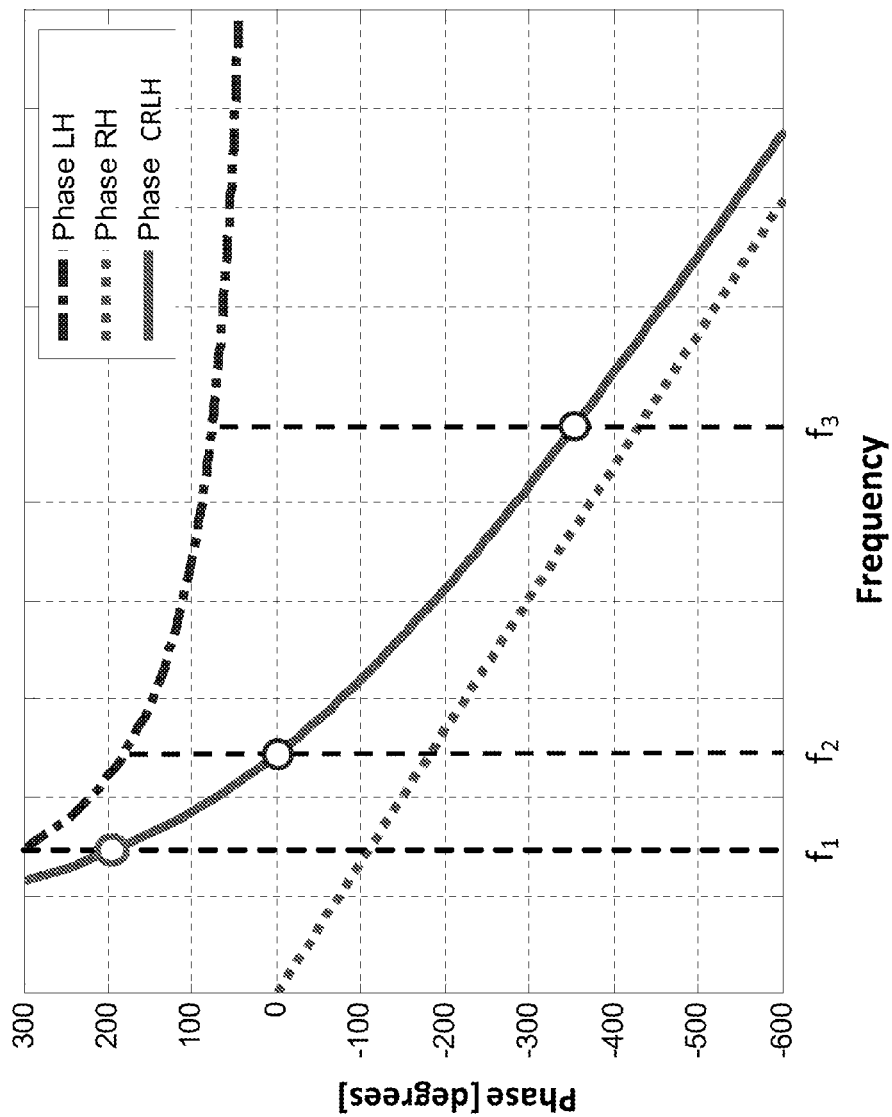
FIG. 13 plots phase-versus-frequency curves for a RH structure (dotted line), a LH structure (dotted-dashed line) and a CRLH structure (solid line)

FIG. 13 plots phase-versus-frequency curves for a RH structure (dotted line), a LH structure (dotted-dashed line) and a CRLH structure (solid line). The RH phase is linear in frequency and can take on only negative values; thus, the choice of a frequency-phase pair is limited. On the other hand, the CRLH phase is non-linear in frequency, and the phase spans to reach large values in both the positive and negative directions. The curvature of the CRLH non-linear curve can be adjusted by designing the CRLH structure accordingly. Thus, two or more desired frequency-phase pairs can be selected from the same CRLH curve. As an example, indicated in FIG. 13 are three different frequencies f1, f2 and f3 corresponding to three different phases. These three pairs of frequency and phase can be obtained by designing the CRLH structure to exhibit the desired phase-versus-frequency curve. As shown in Eq. (1) above, the phase determines the impedance. Therefore, the non-linear phase-to-frequency characteristics of the CRLH structure can provide flexibility for obtaining the optimum impedance values for specified multiple frequency bands, respectively. Furthermore, overall circuit size can be reduced by using lumped elements to construct the CRLH portion instead of using conventional microstrips, which are RH materials.

Figure 14:
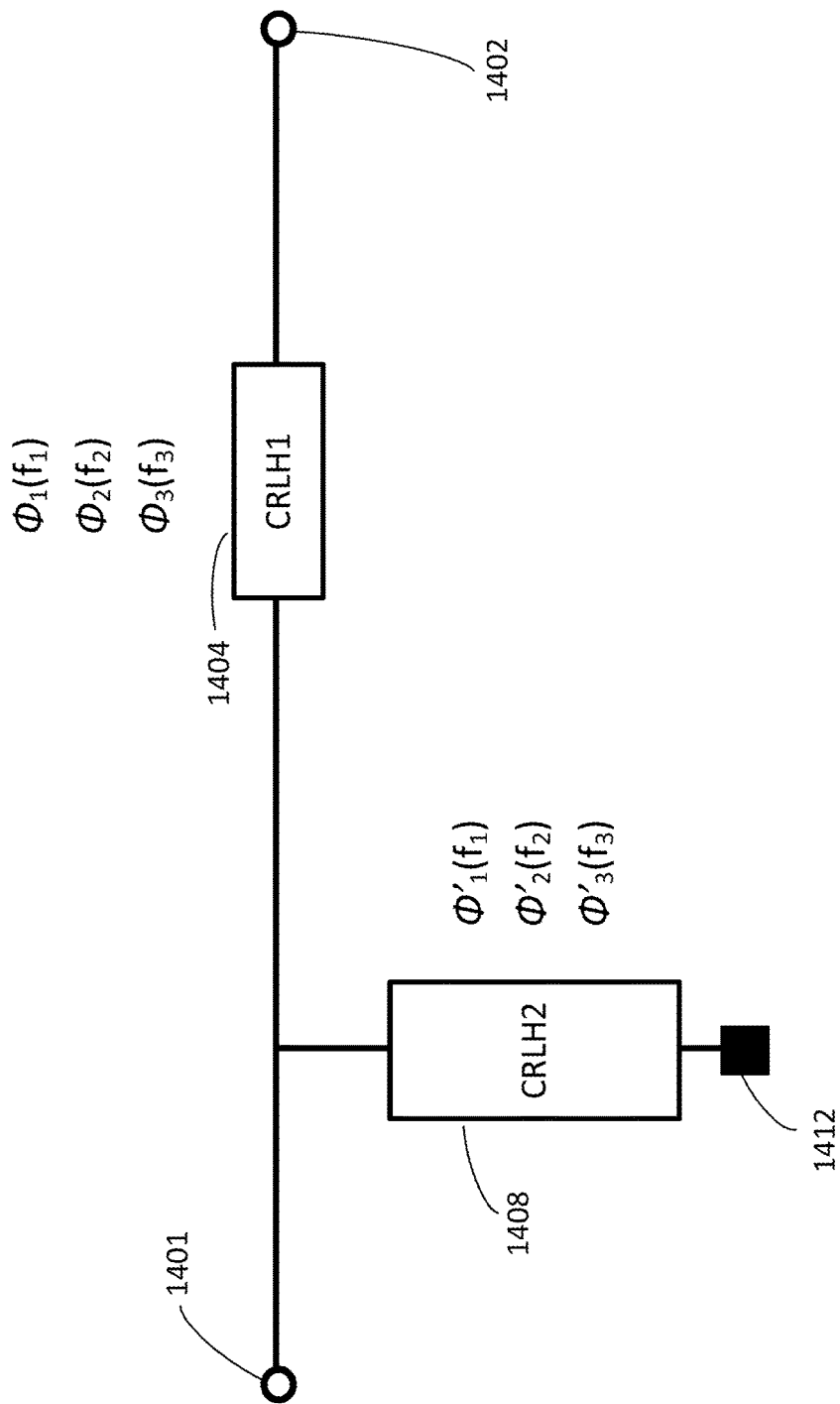
FIG. 14 illustrates a fourth example of the matching module that can be implemented in the PA system of FIG. 6.

FIG. 14 illustrates a fourth example of the matching module that can be implemented in the PA system of FIG. 6. The two end portions of the matching module, a first port 1401 and a second port 1402, are used to implement the matching module in the PA system to have the first port 1401 for inputting the signals and the second port 1402 for outputting the signals or to have the first port 1401 for outputting the signals and the second port 1402 for inputting the signals. This matching module includes a first CRLH portion 1404, denoted by CRLH1 in the figure, which is coupled in series with the signal path, and a second CRLH portion 1408, denoted by CRLH2 in the figure, coupled in shunt to the signal path at one end and having the other end 1412 either ground or short.

Based on the phase-versus-frequency relationship for CRLH structures, as plotted in FIG. 13, the first CRLH portion 1404, CRLH1, and the second CRLH portion 1408, CRLH2, can be designed to have two or more phases corresponding to two or more frequencies, respectively. In the example of FIG. 14, the first CRLH portion 1404, CRLH1, is designed to have three different phases $\Phi 1$, $\Phi 2$ and $\Phi 3$ corresponding to f1, f2 and f3, which represents three different bands, band 1 and band 2 and band 3. Similarly, in this example, the second CRLH portion 1408, CRLH2, is designed to have three different phases $\Phi' 1$, $\Phi' 2$ and $\Phi' 3$ corresponding to f1, f2 and f3. Therefore, the phases $\Phi 1$ and $\Phi' 1$ provide the optimum impedance for the band 1; the phases $\Phi 2$ and $\Phi' 2$ provide the optimum impedance for the band 2; and the phases $\Phi 3$ and $\Phi' 3$ provide the optimum impedance for the band 3. Although this example shows the case of three bands, each CRLH portion can be designed to have two or more phases corresponding to two or more frequency bands, based on the non-linear phase-versus-frequency curve for CRLH structures. The impedance can be further adjusted by including one or more tunable components in each of the CRLH portions, which can be controlled by the controller in the PA system.

Figure 15:
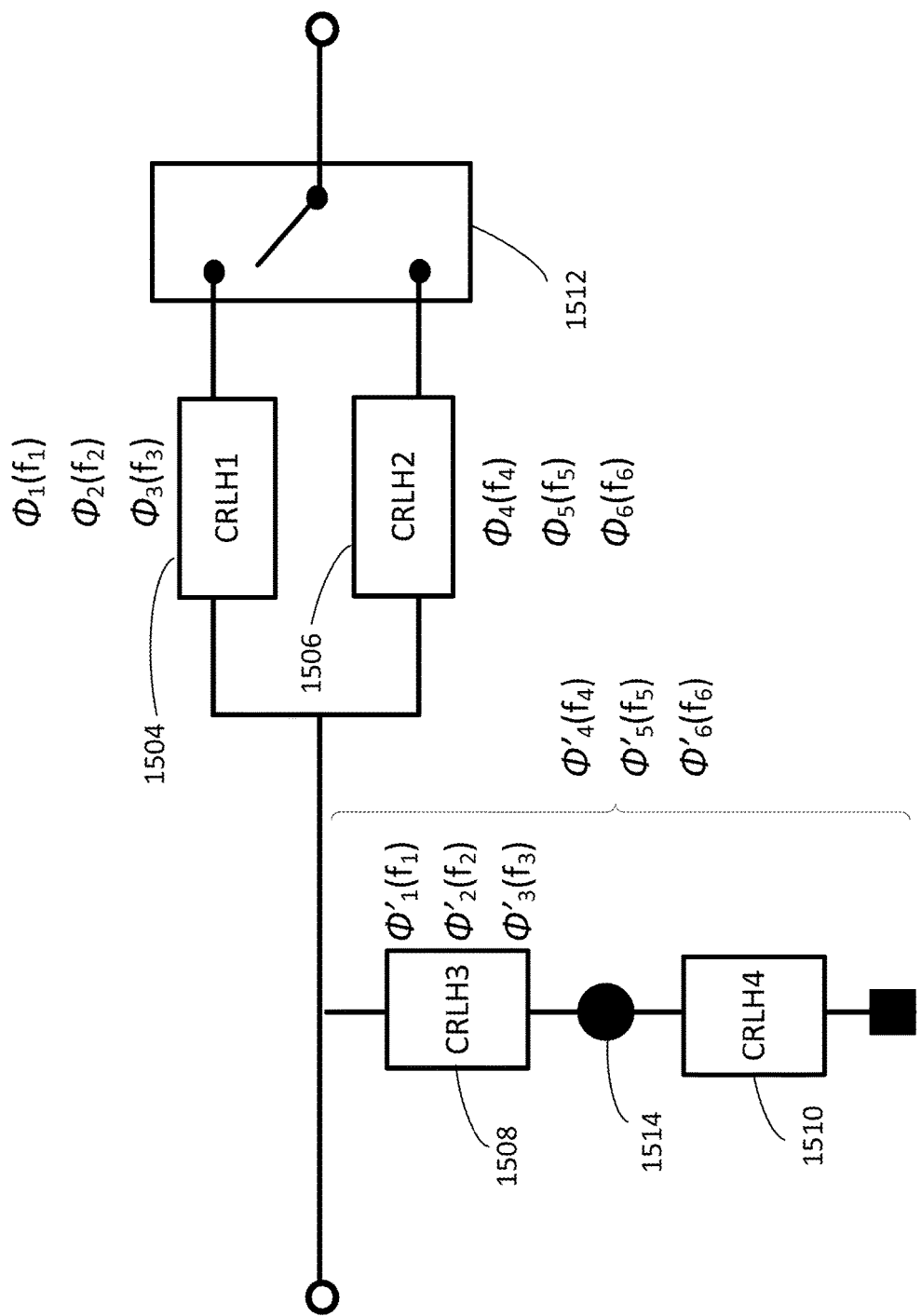
FIG. 15 illustrates a fifth example of the matching module that can be implemented in the PA system of FIG. 6.

More than one CRLH portion can be used for the series part as well as for the shunt part. FIG. 15 illustrates a fifth example of the matching module that can be implemented in the PA system of FIG. 6. This matching module includes a first set of CRLH portions 1504 and 1506, denoted by CRLH1 and CRLH2 in the figure, respectively, which are coupled in parallel, and a second set of CRLH portions 1508 and 1510, denoted by CRLH3 and CRLH4 in the figure, respectively, which are coupled in series. Although two CRLH portions are used in each of the first set and the second set in this example, the number of CRLH portions can be different depending on the number of frequency bands, size considerations and other factors. The first set is coupled in series with the signal path by connecting one end of each of the CRLH portions to the signal path and the other end of each of the CRLH portions to a switch 1512. The two CRLH portions 1508 and 1510 in the second set are coupled alternately in series with a switch 1512 in between to form a shunt stub, which is coupled in shunt with the signal path by having one end connected to the signal path and the other end 1514 being either ground or open.

By designing the CRLH1 and CRLH2 differently to have different phase-versus-frequency curves, the first set can be configured to provide multiple phases corresponding to multiple frequency bands. For example, the CRLH portion 1504, CRLH1, can be designed to have three different phases $\Phi 1$, $\Phi 2$ and $\Phi 3$ corresponding to f1, f2 and f3, which represents three different bands, band 1 and band 2 and band 3, and the CRLH portion 1506, CRLH2, can be designed to have another three different phases $\Phi 4$, $\Phi 5$ and $\Phi 6$ corresponding to f4, f5 and f6, which represents another three different bands, band 4 and band 5 and band 6. The controller in the PA system can control the switch 1512 to select the first CRLH portion, CRLH1, for the band 1, band 2 and band 3, and the second CTLH portion, CRLH2, for the band 4, band 5 and band 6. Similarly, the CRLH portion 1508, CRLH3, can be designed to have three different phases Φ'1, Φ'2 and Φ'3 corresponding to f1, f2 and f3. Furthermore, by tuning on the switch 1514 the two shunt CRLH portions 1508 and 1510, CRLH3 and CRLH5, together can be designed to have another three different phases Φ'4, Φ'5 and Φ'6 corresponding to f4, f5 and f6. As a result, this specific example can provide the optimum impedance for each of the six bands, by having Φ1 and Φ'1 for the band 1, Φ2 and Φ'2 for the band 2, Φ3 and Φ'3 for the band 3, Φ4 and Φ'4 for the band 4, Φ5 and Φ'5 for the band 5, and Φ6 and Φ'6 for the band 6. As noted earlier, each CRLH portion can be designed to have two or more phases corresponding to two or more frequency bands, based on the non-linear phase-versus-frequency curve for CRLH structures. The impedance can be further adjusted by including one or more tunable components in each of the CRLH portions, which can be controlled by the controller in the PA system.

Figure 16:
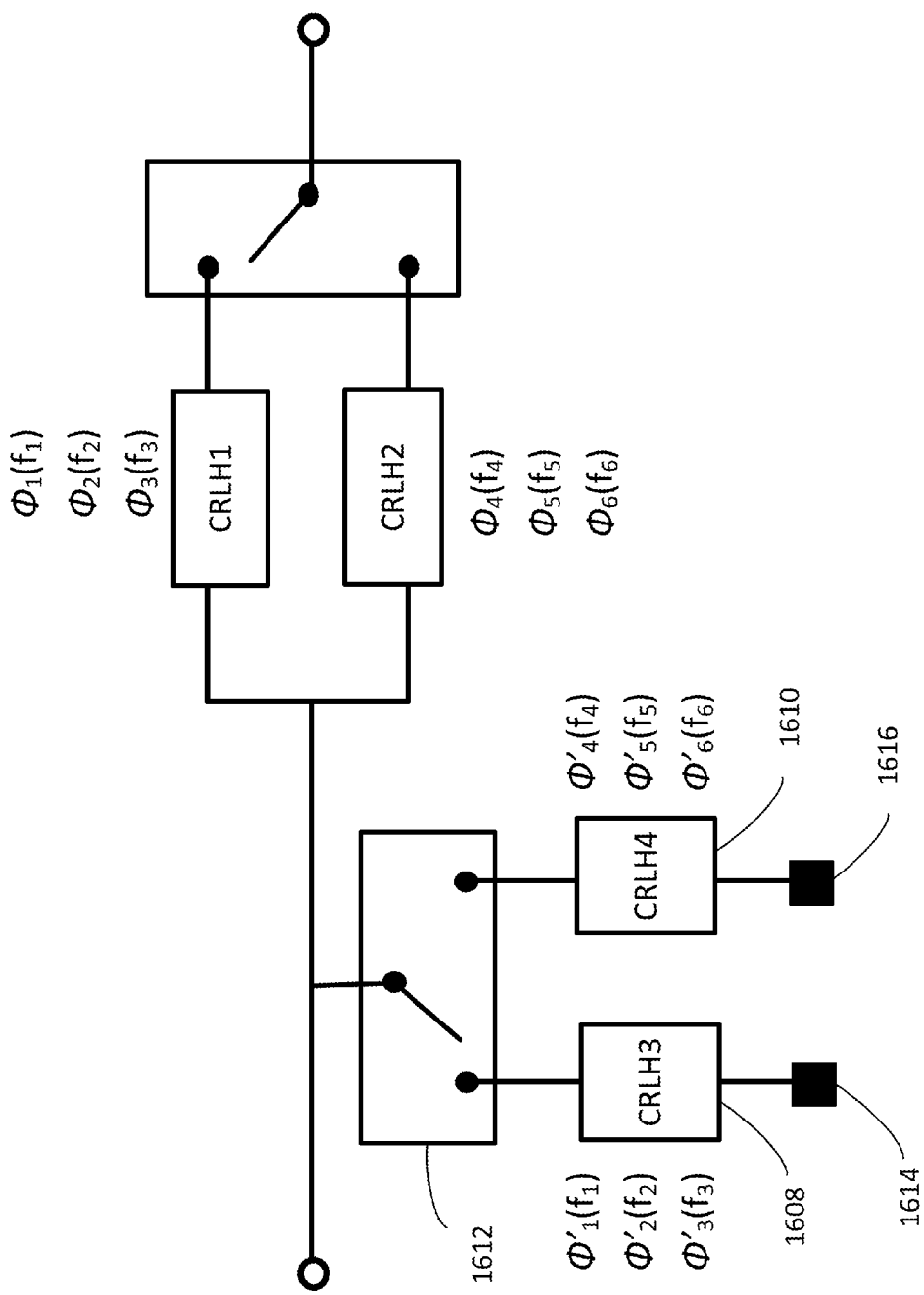
FIG. 16 illustrates a sixth example of the matching module that can be implemented in the PA system of FIG. 6.

FIG. 16 illustrates a sixth example of the matching module that can be implemented in the PA system of FIG. 6. This matching module includes CRLH portions 1608 and 1610, CRLH3 and CRLH4, coupled in parallel to configure the shunt part instead of having the CRLH portions in series with a switch as in the previous example of FIG. 15. One end of each CRLH portion is connected to a switch 1612, and the other end 1614 or 1616 can be either ground or short. The CRLH portion 1610, CRLH4, is designed to provide three different phases Φ'4, Φ'5 and Φ'6 corresponding the band 4 and band 5 and band 6, which are provided by the series combination of the CRLH portions 1508 and 1510 in the previous example of FIG. 15. The controller in the PA system controls the switch 1612 to select the CRLH 1608, CRLH3, for the band 1, band 2 and band 3, and the CRLH 1610, CRLH4, for the band 4, band 5 and band 6. The series part having CRLH1 and CRLH2 is configured similarly to the example of FIG. 15. As a result, this specific example can provide the optimum impedance for each of the six bands, by having Φ1 and Φ'1 for the band 1, Φ2 and Φ'2 for the band 2, Φ3 and Φ'3 for the band 3, Φ4 and Φ'4 for the band 4, Φ5 and Φ'5 for the band 5, and Φ6 and Φ'6 for the band 6. As noted earlier, each CRLH portion can be designed to have two or more phases corresponding to two or more frequency bands, based on the non-linear phase-versus-frequency curve for CRLH structures. The impedance can be further adjusted by including one or more tunable components in each of the CRLH portions, which can be controlled by the controller in the PA system. The number of CRLH portions in the shunt part as well as in the series part can vary depending on applications.

Figure 17:
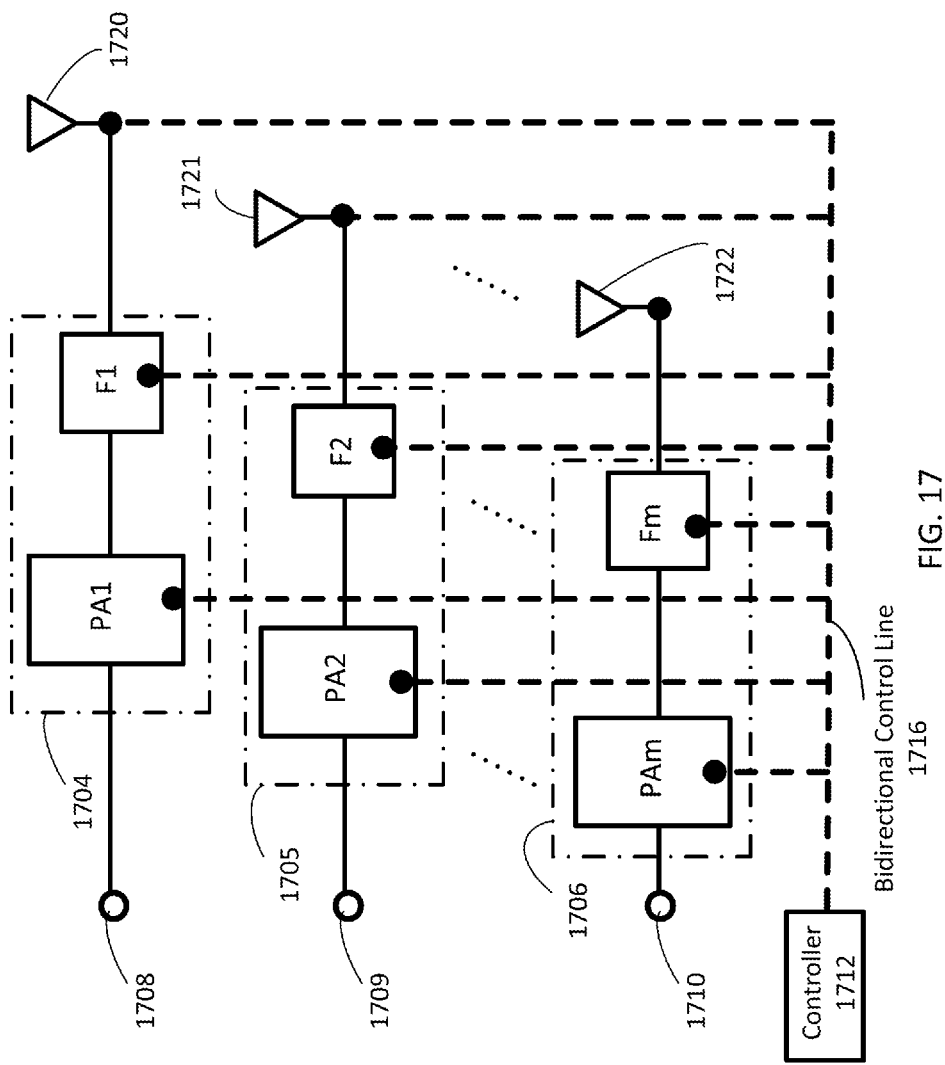
FIG. 17 illustrates a first example of a Tx system where two or more Tx modules are coupled to multiple input ports, respectively, and coupled to multiple antennas, respectively.
Figure 18:
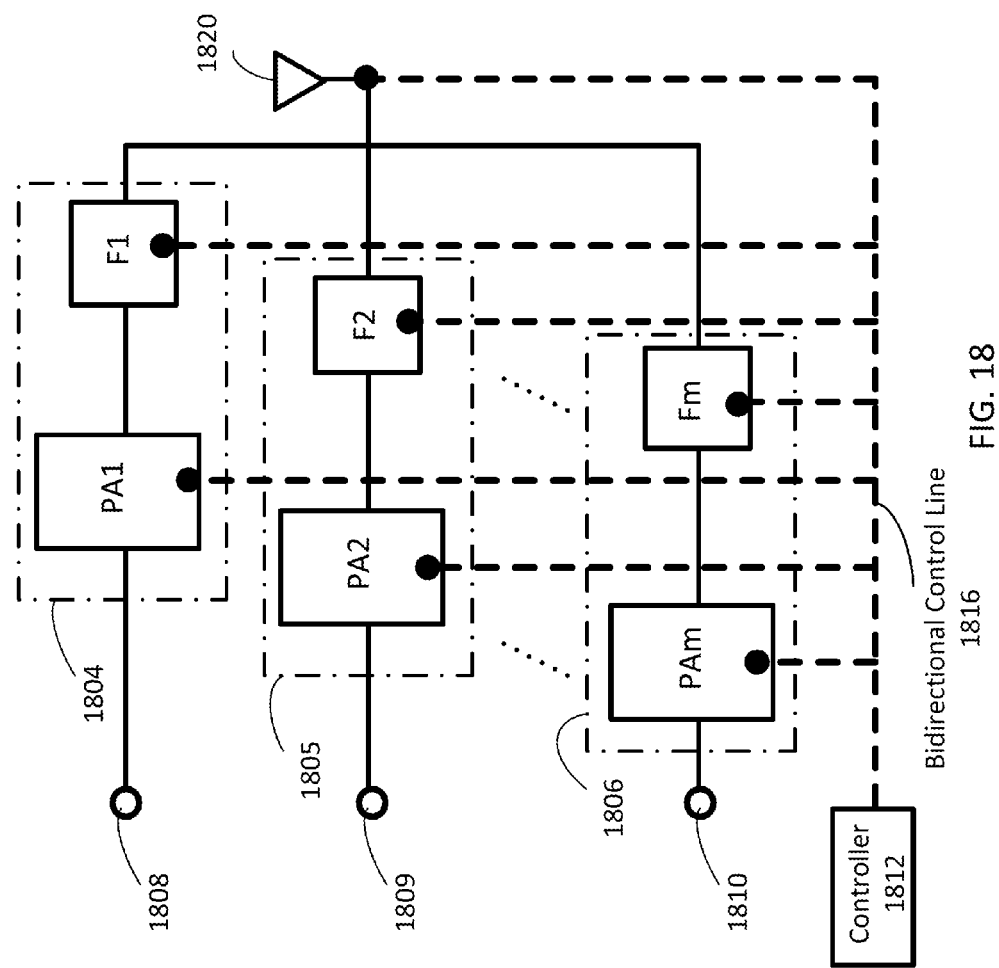
FIG. 18 illustrates a second example of a Tx system where two or more Tx modules are coupled to multiple input ports, respectively, and coupled to a single antenna.

Turning back to FIG. 4, part of the front end module 400 having the PA system 412, the Tx filter system 416 and the corresponding signal path can be viewed as an independent Tx module, which plays a major role in adjusting perturbed properties as described above. Multiple Tx modules can be used for a wider range of applications. FIG. 17 illustrates a first example of a Tx system including two or more Tx modules 1704, 1705 . . . and 1706 coupled to input ports 1708, 1709 . . . and 1710, respectively. There are m number of the Tx modules and the respective m number of the input ports. Each of the Tx modules includes a PA system and a filter system, as indicated by PA1 and F1, PA2 and F2 . . . and PAm and Fm in the figure. A controller 1712 is coupled to each of the Tx modules through a bidirectional control line 1716. In the example shown in FIG. 17, the controller is coupled to control the PA system and the filter system in each of the Tx modules. The Tx system can include multiple antennas 1720, 1721 . . . and 1722 coupled to the multiple Tx modules 1704, 1705 . . . and 1706, respectively, as illustrated in FIG. 17. In another configuration, the Tx system can include a single antenna coupled to the multiple Tx modules. FIG. 18 illustrates a second example of a Tx system including two or more Tx modules 1804, 1805 . . . and 1806 coupled to input ports 1808, 1809 . . . and 1810, respectively, wherein a single antenna 1820 is coupled to the Tx modules 1804, 1805 . . . and 1806. Each of the antennas 1720, 1721 . . . and 1722 is coupled to the controller 1712 in the first example of FIG. 17, and similarly the single antenna 1820 in the second example of FIG. 18 is coupled to the controller 1812. One or more of the plurality of antennas 1720, 1721 . . . 1722 in the first example may be tunable antennas that are controlled by the controller 1712 to adjust the properties associated with the signals. Similarly, the antenna 1810 in the second example may be a tunable antenna that is controlled by the controller 1812 to adjust the properties associated with the signals.

In both the first example and the second example, the controller is configured to receive information on the signals and conditions and to control each of the Tx modules to process the signals corresponding to a frequency band selected from the plurality of frequency bands, a mode selected from the plurality of modes and the conditions during a time interval. Further, the controller controls each of the Tx modules variably with time as the information varies to meet specifications on properties associated with the signals during each time interval. For example, the information may include selection of the mode and the frequency band of the signals when the user enters a foreign country. Accordingly, the controller controls each of the Tx modules to meet the specifications on the properties associated with the signals in the mode and in the frequency band. In another example, the information may include a change in the conditions such as a change in distance to a base station. Accordingly, the controller controls each of the Tx modules to have less output power than nominal output power when the distance is shorter than a nominal distance and more output power than the nominal output power when the distance is longer than the nominal distance. In yet another example, the information may include changes in the conditions caused by a head, a hand, a metal object or other interference-causing objects placed in the proximity of the antenna, which can affect the signal properties by causing detuning such as a shift in frequency and/or impedance change. Based on the information, the controller controls each of the Tx modules to provide the frequency band and/or an impedance value corresponding to the frequency band and the conditions during the time interval. In the Tx system having multiple Tx modules as in the first example and the second example, two or more of the Tx modules may process signals in the same band and the same mode or in different bands and different modes at the same time. Thus, it is possible to process two types of signals at the same time, for example, by configuring one of the Tx modules to process voice signals and another one of the Tx modules to process data signals.

For the case of having multiple antennas as in the first example of FIG. 17, certain changes in the conditions affecting one of the multiple antennas may also have effects on the other antennas due to interactions among the antennas. Because of the limited space in handsets, for example, coupling between antennas is likely to occur; therefore, it is necessary to tune all the branches as a full system. For example, detuning caused by a heads, a hand or other interference-causing objects placed in the proximity of one antenna can affect the other antennas as well. In such a complex case, the controller controls each of the Tx modules iteratively to meet the specifications on the properties associated with the signals in the mode and in the frequency band. In this case, the PA system in each of the Tx modules is controlled to follow the process illustrated in FIG. 8 iteratively until the properties of signals outputting from each Tx module meet the specifications as a full system.

What is claimed is:

1. A transmit (Tx) system configured to operate for a plurality of modes and for a plurality of frequency bands, comprising:
   a plurality of input ports for inputting signals;
   a plurality of Tx modules coupled to the plurality of input ports, respectively, each of the plurality of Tx modules comprising a PA system and a filter system; and
   a controller coupled to each of the PA systems and filter systems of the plurality of Tx modules;
   wherein the controller is configured to receive information associated with a change in condition and to control each PA system and a filter system of each of the plurality of Tx modules based at least in part on a frequency band selected from the plurality of frequency bands, a mode selected from the plurality of modes and information associated with the change in condition during a time interval, wherein the controller controls each of the plurality of Tx modules variably with time as the information varies during each time interval;
   wherein each PA system comprises a plurality of amplifying modules and a plurality of matching modules, the plurality of amplifying modules and the plurality of matching modules being alternatively coupled in series, each of the plurality of amplifying modules comprising a plurality of banks, each of the plurality of banks comprising one or more transistors, wherein the controller is configured to control each PA system by controlling a signal path through the plurality of amplifying modules and the plurality of matching modules by selecting one bank of the plurality of banks in each of the amplifying modules as part of the signal path;
   wherein a first bank of the plurality of banks of one of the plurality of amplifying modules comprises a first number of transistors and a second bank of the plurality of banks of the one of the plurality of amplifying modules comprises a second number of transistors, the second number of transistors being different from the first number of transistors.

2. The Tx system of claim 1, further comprising a plurality of antennas coupled to the plurality of Tx modules, respectively, for transmitting out the signals, each of the plurality of antennas coupled to the controller.

3. The Tx system of claim 2, wherein a change in condition affects one of the plurality of antennas.

4. The Tx system of claim 2, wherein one or more of the plurality of antennas are tunable antennas that are configured to be controlled by the controller.

5. The Tx system of claim 2, wherein the change in condition is caused by a head, a hand, a metal object or other interference-causing objects placed in the proximity of one of the plurality of antennas.

6. The Tx system of claim 2, wherein the change in condition is caused by a head, a hand, a metal object or other interference-causing objects-placed in the proximity of the antenna.

7. The Tx system of claim 1, further comprising an antenna coupled to the plurality of Tx modules and to the controller.

8. The Tx system of claim 7, wherein the antenna is a tunable antenna that is configured to be controlled by the controller.

9. The Tx system of claim 1, wherein the change in condition comprises a change in distance to a base station, and based on the information the controller is configured to control each of the plurality of Tx modules to have less output power than nominal output power when the distance is shorter than a nominal distance and more output power than the nominal output power when the distance is longer than the nominal distance.

10. The Tx system of claim 1, wherein the change in condition causes a shift in frequency, and based on the information the controller is configured to controls each of the Tx modules to provide the frequency band during the time interval.

11. The Tx system of claim 1, wherein the change in condition causes a shift in impedance, and based on the information the controller is configured to control each of the Tx modules to provide an impedance corresponding to the frequency band and the change in condition during the time interval.

12. The Tx system of claim 1, wherein the plurality of Tx modules comprise a first Tx module for processing voice signals and a second Tx module for processing data signals during the time interval.

* * * * *